United States Patent
Katsuhara et al.

(10) Patent No.: US 10,175,782 B2
(45) Date of Patent: Jan. 8, 2019

(54) INPUT APPARATUS, SENSOR, KEYBOARD, AND ELECTRONIC APPARATUS

(71) Applicant: SONY CORPORATION, Tokyo (JP)

(72) Inventors: Tomoko Katsuhara, Kanagawa (JP); Hiroto Kawaguchi, Kanagawa (JP); Akira Ebisui, Kanagawa (JP); Taizo Nishimura, Kanagawa (JP); Hiroshi Mizuno, Kanagawa (JP); Yoshiaki Sakakura, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 16 days.

(21) Appl. No.: 15/523,187

(22) PCT Filed: Nov. 4, 2015

(86) PCT No.: PCT/JP2015/005528
§ 371 (c)(1),
(2) Date: Apr. 28, 2017

(87) PCT Pub. No.: WO2016/075900
PCT Pub. Date: May 19, 2016

(65) Prior Publication Data
US 2017/0322647 A1    Nov. 9, 2017

(30) Foreign Application Priority Data

Nov. 14, 2014  (JP) ................. 2014-232111

(51) Int. Cl.
*G06F 3/0354* (2013.01)
*G06F 3/02* (2006.01)
*G06F 1/16* (2006.01)
*G06F 3/041* (2006.01)
*G06F 3/044* (2006.01)
*H03K 17/96* (2006.01)
*H03K 17/975* (2006.01)

(52) U.S. Cl.
CPC .......... *G06F 3/03547* (2013.01); *G06F 1/169* (2013.01); *G06F 3/02* (2013.01); *G06F 3/0202* (2013.01); *G06F 3/044* (2013.01); *G06F 3/0412* (2013.01); *H03K 17/96* (2013.01); *H03K 17/975* (2013.01)

(58) Field of Classification Search
CPC .... G06F 3/03547; G06F 3/044; G06F 3/0412; G06F 3/0202; G06F 1/169; G06F 3/02; H03K 17/975; H03K 17/96
See application file for complete search history.

(56) References Cited

FOREIGN PATENT DOCUMENTS

| JP | 2005-166466 A | 6/2005 |
| JP | 2009-016330 A | 1/2009 |
| JP | 2014-123430 A | 7/2014 |
| WO | 2014/084873 A1 | 6/2014 |
| WO | 2014/162647 A1 | 10/2014 |

*Primary Examiner* — Abhishek Sarma
(74) *Attorney, Agent, or Firm* — Chip Law Group

(57) ABSTRACT

An input apparatus includes a conductive layer having flexibility, a plurality of structures, a reaction force of which is non-linearly changed with respect to a pressing amount, a capacitance-type sensor layer, and an intermediate layer disposed between the plurality of structures and the sensor layer. The intermediate layer has a plurality of hole portions into which the plurality of structures is pressed, respectively.

31 Claims, 30 Drawing Sheets

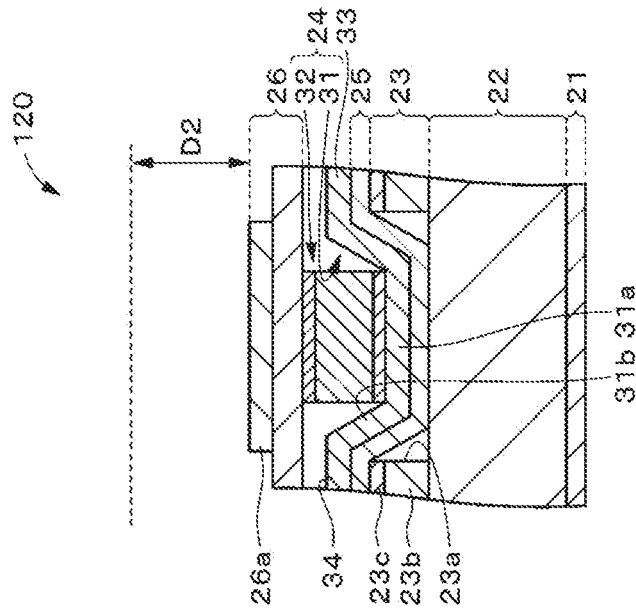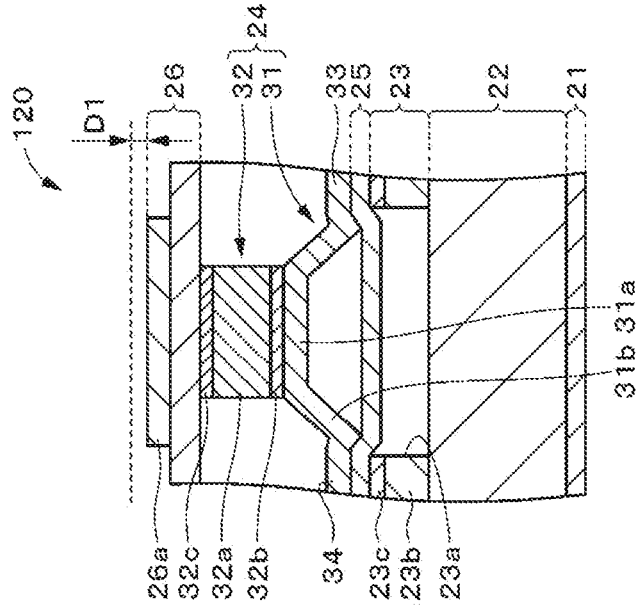

INPUT APPARATUS, SENSOR, KEYBOARD, AND ELECTRONIC APPARATUS

CROSS REFERENCE TO RELATED APPLICATIONS

This application is a U.S. National Phase of International Patent Application No. PCT/JP2015/005528 filed on Nov. 4, 2015, which claims priority benefit of Japanese Patent Application No. JP 2014-232111 filed in the Japan Patent Office on Nov. 14, 2014. Each of the above-referenced applications is hereby incorporated herein by reference in its entirety.

TECHNICAL FIELD

The present technology relates to an input apparatus, a sensor, a keyboard, and an electronic apparatus. Specifically, the present technology relates to an input apparatus provided with a plurality of structures.

BACKGROUND ART

In recent years, for mobile PCs (Personal Computer) and tablet PCs, reductions in size and thickness are being demanded. For keyboards attached thereto, reductions in size and thickness are being demanded along with achieving lighter, more compact main bodies.

While touch panels on which displays are touched and operated are in the mainstream, moving hands between a display and a keyboard during an operation impairs usability. For this reason and the like, touchpads attached to keyboards are still being demanded. The areas of keyboards are increasingly reduced, and along with this, disposition of touchpad functions is more important.

For example, in Patent Literature 1, there has been proposed such an input apparatus that a different input means can be operated on the same operation surface.

CITATION LIST

Patent Literature

Patent Literature 1: Japanese Patent Application Laid-open No. 2005-166466

DISCLOSURE OF INVENTION

Technical Problem

Thus, the present technology has an object to provide an input apparatus, a sensor, a keyboard, and an electronic apparatus which allow two kinds of input operations to be performed on the same operation screen.

Solution to Problem

To solve the problem described above, according to a first technology, there is provided an input apparatus, including:
 a conductive layer having flexibility;
 a plurality of structures, a reaction force of which is non-linearly changed with respect to a pressing amount;
 a capacitance-type sensor layer; and
 an intermediate layer disposed between the plurality of structures and the sensor layer, in which
 the intermediate layer has a plurality of hole portions into which the plurality of structures is pressed, respectively.

According to a second technology, there is provided a sensor, including:
 a conductive layer having flexibility;
 a plurality of structures, a reaction force of which is non-linearly changed with respect to a pressing amount;
 a capacitance-type sensor layer; and
 an intermediate layer disposed between the plurality of structures and the sensor layer, in which
 the intermediate layer has a plurality of hole portions into which the plurality of structures is pressed, respectively.

According to a third technology, there is provided a sensor, including:
 a conductive layer having flexibility;
 a structure, a reaction force of which is non-linearly changed with respect to a pressing amount;
 a capacitance-type sensor layer; and
 an intermediate layer disposed between the structure and the sensor layer, in which
 the intermediate layer has a hole portion into which the structure is pressed.

According to a fourth technology, there is provided a keyboard, including:
 a conductive layer having flexibility;
 a plurality of structures, a reaction force of which is non-linearly changed with respect to a pressing amount;
 a capacitance-type sensor layer; and
 an intermediate layer disposed between the plurality of structures and the sensor layer, in which
 the intermediate layer has a plurality of hole portions into which the plurality of structures is pressed, respectively.

According to a fifth technology, there is provided an electronic apparatus, including:
 a conductive layer having flexibility;
 a plurality of structures, a reaction force of which is non-linearly changed with respect to a pressing amount;
 a capacitance-type sensor layer; and
 an intermediate layer disposed between the plurality of structures and the sensor layer, in which
 the intermediate layer has a plurality of hole portions into which the plurality of structures is pressed, respectively.

Advantageous Effects of Invention

As described above, according to the present technology, it is possible to perform two kinds of input operations on the same operation screen.

BRIEF DESCRIPTION OF DRAWINGS

FIG. 17A is a cross-sectional view for explaining an operation example of the sensor module at a time of a gesture input operation. FIG. 17B is a cross-sectional view for explaining a configuration example of the sensor module at a time of a key input operation.

MODE(S) FOR CARRYING OUT THE INVENTION

Embodiments of the present technology will be described with reference to the drawings in the following order. It should be noted that for each of the drawings of the embodiments below, the same or corresponding parts are denoted by the same symbols.

1. First embodiment (example of providing plurality of structures between reference electrode layer and intermediate layer)
2. Second embodiment (example of providing reference electrode layer between plurality of structures and intermediate layer)
3. Third embodiment (example in which embossed layer doubles as reference electrode layer)
4. Fourth embodiment (example in which embossed layer doubles as sensor layer)
5. Fifth embodiment (example of uneven film)
6. Sixth embodiment (example of uneven structure)

<1. First Embodiment>

[Configuration of Electronic Apparatus]

Figure 1:
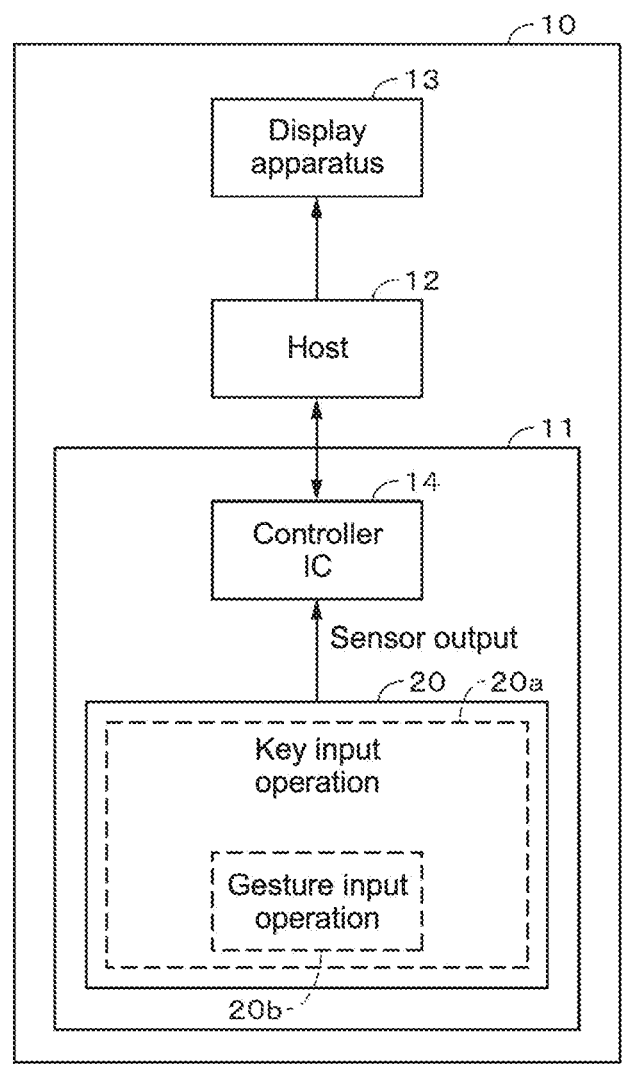
FIG. 1 is a block diagram showing a configuration example of an electronic apparatus according to a first embodiment of the present technology.

As shown in FIG. 1, an electronic apparatus 10 is provided with a keyboard 11, a host 12 as a main body of the electronic apparatus 10, and a display apparatus 13. It should be noted that, in FIG. 1, the keyboard 11 is provided in the electronic apparatus 10, and the keyboard 11 and the electronic apparatus 10 are integrally configured. However, such a configuration that the keyboard 11 is provided as a peripheral apparatus outside of the electronic apparatus 10 may be used. Further, the display apparatus 13 is provided in the electronic apparatus 10, and the display apparatus 13 and the electronic apparatus 10 are integrally configured. However, the configuration may be used in which the display apparatus 13 is provided as a peripheral apparatus in the outside of the electronic apparatus 10.

Examples of the electronic apparatus 10 include a personal computer, a mobile phone such as a smartphone, a tablet computer, a television, a camera, a mobile game machine, a car navigation system, and a wearable apparatus, but the electronic apparatus 10 is not limited to those.

(Keyboard)

The keyboard 11 is an example of an input apparatus, and is provided with a sensor module (sensor) 20 and a controller IC (Integrated Circuit) 14. The sensor module 20 can perform both of a key input operation 20a and a gesture input operation 20b. The sensor module 20 detects a change in capacitance in response to an input operation and outputs an electrical signal corresponding thereto to the controller IC 14. On the basis of the electrical signal supplied from the sensor module 20, the controller IC 14 outputs information corresponding to the operation with respect to the sensor module 20 to the host 12. For example, the controller IC 14 outputs information relating to a pressed key (for example, scan code), coordinate information, or the like.

(Host)

On the basis of the information supplied from the keyboard 11, the host 12 performs various processes. For example, the host 12 performs processes of displaying character information with respect to the display apparatus 13, moving a cursor displayed on the display apparatus 13, or the like.

(Display Apparatus)

On the basis of an image signal, a control signal, and the like supplied from the host 12, the display apparatus 13 displays an image (screen). Examples of the display apparatus 13 include a liquid crystal display, an electro-luminescence (EL) display, a CRT (Cathode Ray Tube) display, and a plasma display panel (PDP), but the display apparatus 13 is not limited thereto.

[Configuration of Sensor Module]

Figure 2A:
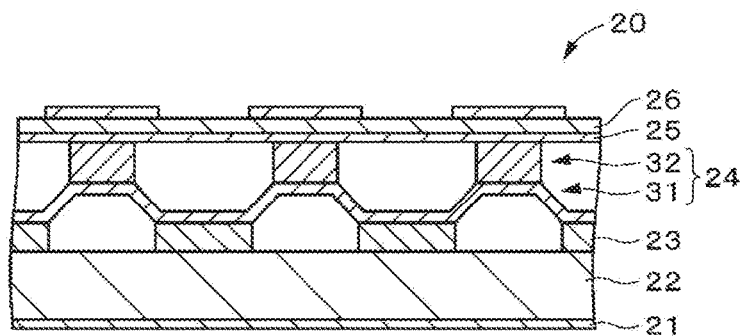
FIG. 2A is a cross-sectional view showing a configuration example of the sensor module according to the first embodiment of the present technology.
Figure 2B:
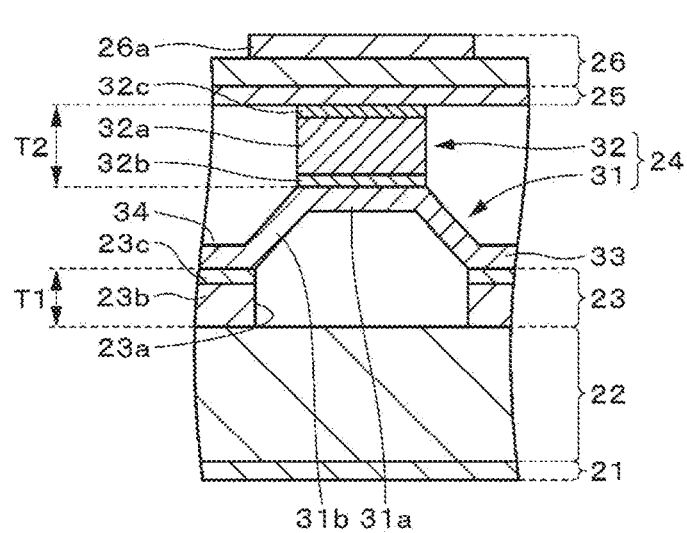
FIG. 2B is a cross-sectional view showing a part of the sensor module shown in FIG. 2A in an enlarged manner.

Hereinafter, with reference to FIG. 2A and FIG. 2B, a configuration example of the sensor module 20 will be described. The sensor module 20 is provided with a reference electrode layer 21 as a first conductive layer, a sensor layer 22, an intermediate layer (spacer layer) 23, a plurality of structures 24, a reference electrode layer 25 as a second conductive layer, and a key top layer 26. In the following, of both main surfaces of the sensor module 20 and configuration elements (configuration members), a main surface on an operation surface side is referred to as a front surface (first surface), and a main surface opposite thereto is referred to as back surface (second surface) as appropriate.

The sensor module 20 electrostatically detects a change in distance between the reference electrode layer 25 and the sensor layer 22 due to an input operation with respect to the key top layer 26, thereby detecting the input operation. The input operation is a key input operation with respect to the key top layer 26 or a gesture operation on the key top layer 26.

The reference electrode layer 25 is disposed on the front surface side of the sensor layer 22 at a predetermined interval, and the reference electrode layer 21 is disposed so as to be adjacent thereto on the back surface side. In this way, the reference electrode layers 21 and 25 are disposed on the both sides of the sensor layer 22, with the result that an external noise (external electrical field) can be prevented from entering the sensor module 20. Between the sensor layer 22 and the reference electrode layer 25, the intermediate layer 23 and the plurality of structures 24 are disposed.

(Reference Electrode Layer)

The reference electrode layer 21 configures the back surface of the sensor module 20, and is disposed so as to be opposed to the reference electrode layer 25 in a thickness direction of the sensor module 20. The reference electrode layer 21 has a higher flexural rigidity than the sensor layer 22, the reference electrode layer 25, and the like, for example, and functions as a support plate for the sensor module 20. As the reference electrode layer 21, for example, a metal plate including a metal material such as an Al alloy and a Mg alloy, a conductive plate such as a carbon fiber reinforced plastic, or a laminated body in which a conductive layer such as a plating film, a deposited film a sputtering film, and a metal foil is formed on an insulation layer including a plastic material and the like can be used. The reference electrode layer 21 is connected to a ground potential, for example.

The shape of the reference electrode layer 21 may be a flat plate shape, for example, but is not limited to this. For example, the reference electrode layer 21 may have a step portion. Further, the reference electrode layer 21 may have one or a plurality of openings formed thereon. Further, the reference electrode layer 21 may have a mesh-like configuration.

The reference electrode layer 25 has flexibility. Therefore, the reference electrode layer 25 can be deformed in accordance with pressing of the operation surface. The reference electrode layer 25 is a conductive film, for example. As the conductive film, for example, a stainless used steel (SUS) film, a carbon printed film, an ITO (Indium Tin Oxide) film, a metal evaporation film on which metal such as Cu is evaporated can be used. The reference electrode layer 25 is connected to a ground potential, for example.

(Sensor Layer)

The sensor layer 22 is disposed between the reference electrode layer 21 and the reference electrode layer 25, and can electrostatically detect a change in distance to the reference electrode layer 25 on the operation surface side. Specifically, the sensor layer 22 includes a plurality of detection units 22s, and the plurality of detection units 22s detects a capacitance that is changed depending on the distance to the reference electrode layer 25.

Figure 3:
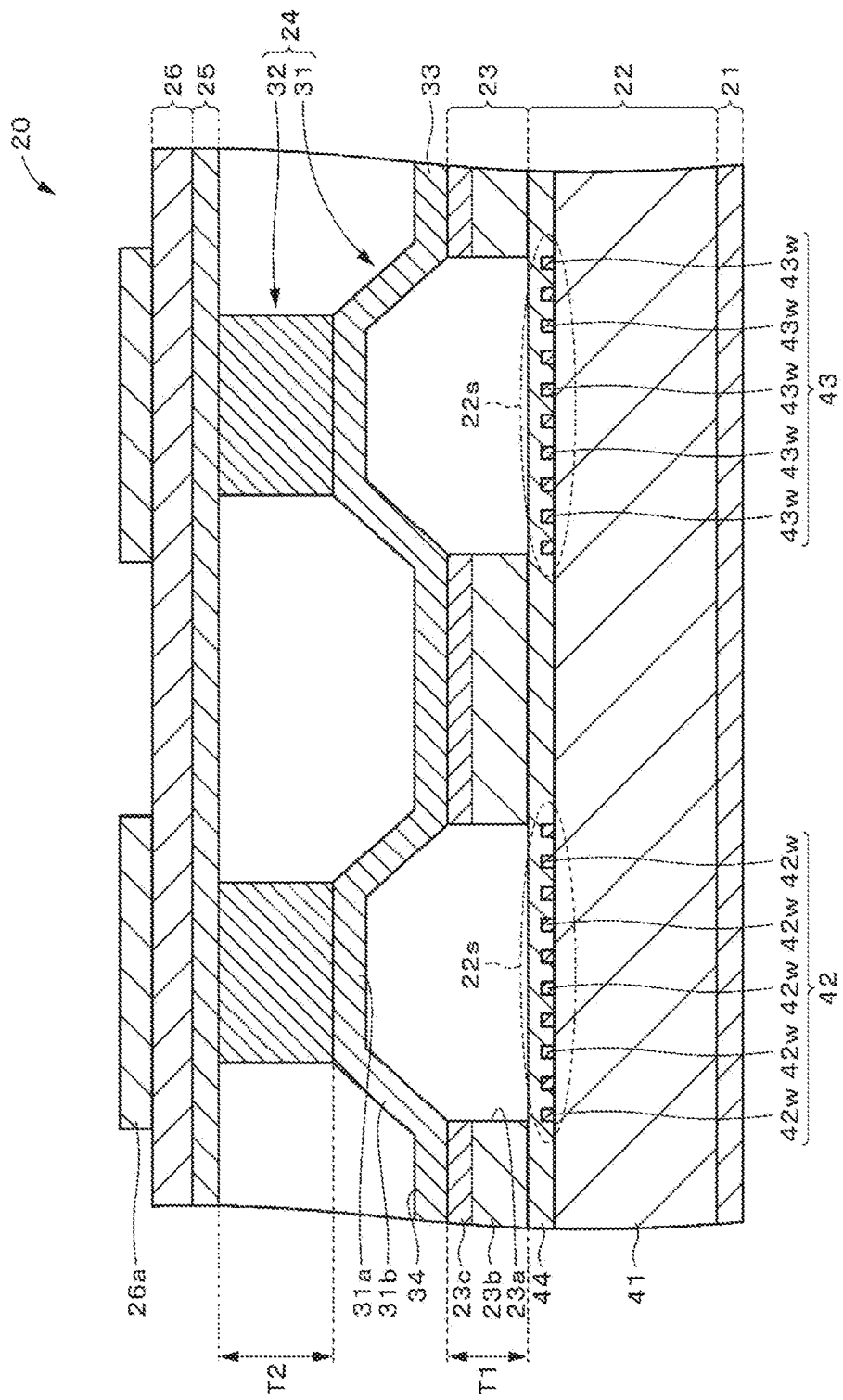
FIG. 3 is a cross-sectional view showing a configuration example of a sensor layer.

As shown in FIG. 3, the sensor layer 22 is a capacitance type sensor layer and is provided with a base material 41, a plurality of X electrodes 42, a plurality of Y electrodes 43, and an insulation layer 44. It should be noted that in this specification, an X axis and a Y axis mean axes that are orthogonal to each other in the front surface of the base material 41. The plurality of X electrodes 42 and the plurality of Y electrodes 43 are disposed on the front surface of the base material 41. The insulation layer 44 is disposed on the front surface of the base material 41 so as to cover the plurality of X electrodes 42 and the plurality of Y electrodes 43. The combination of the X electrodes 42 and the Y electrodes 43 constitute the plurality of detection units 22s. The plurality of detection units 22s is two-dimensionally arranged on the front surface of the base material 41 in accordance with the key arrangement of the sensor module 20.

As the base material 41, for example, polymer resin film or a glass substrate can be used. Examples of a material of the polymer resin film include polyethylene terephthalate (PET), polyethylene naphthalate (PEN), polycarbonate (PC), acrylic resin (PMMA), polyimide (PI), triacetylcellulose (TAC), polyester, polyamide (PA), aramid, polyethylene (PE), polyacrylate, polyether sulfone, polysulfone, polypropylene (PP), diacetyl cellulose, polyvinyl chloride, epoxy resin, urea resin, urethane resin, melamine resin, cyclic olefin polymer (COP), and norbornene-based thermoplastic resin.

As a material of the insulation layer 44, an inorganic material or an organic material may be used. Examples of the inorganic material include $SiO_2$, SiNx, SiON, $Al_2O_3$, $Ta_2O_5$, $Y_2O_3$, $HfO_2$, HfAlO, $ZrO_2$, $TiO_2$. Examples of the organic material include polyacrylate such as PMMA (polymethylmethacrylate), PVA (polyvinyl alcohol), PS (polystyrene), transparent polyimide, polyester, epoxy, polyvinyl phenol, and polyvinyl alcohol.

Hereinafter, with reference to FIG. 4A, FIG. 4B, and FIGS. 5A and 5B, a configuration example of the X and Y electrodes will be described. Note that, in FIG. 4A, FIG. 4B, and FIGS. 5A and 5B, for ease of illustration, such a configuration that the detection units 22s are two-dimensionally arranged in a matrix pattern is shown. As described above, the arrangement of the detection units 22s is selected depending on the key arrangement of the sensor module 20. The two-dimensional arrangement in the matrix pattern is merely an example, and the arrangement is not limited to this.

Figure 4A:
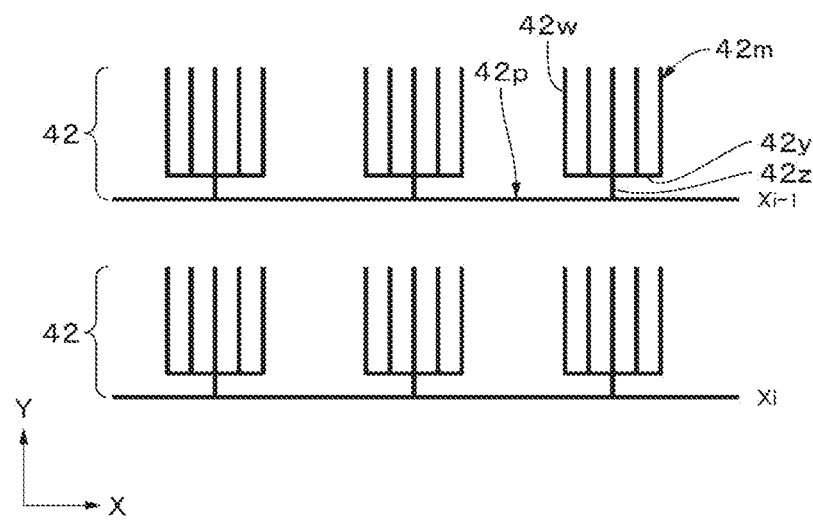
FIG. 4A is a plan view showing a configuration example of an X electrode.

As shown in FIG. 4A, the X electrode 42 as a first electrode is provided with an electrode line portion 42p, a plurality of unit electrode bodies 42m, and a plurality of connection portions 42z. The electrode line portion 42p is extended in the X axis direction. The plurality of unit electrode bodies 42m is disposed at constant intervals in the X axis direction. The electrode line portion 42p and the unit electrode bodies 42m are separated with a predetermined interval, and are connected by the connection portions 42z. It should be noted that the connection portions 42z may be omitted, and the unit electrode bodies 42m may be directly provided on the electrode line portion 42p.

The unit electrode bodies 42m has a comb-like shape as a whole. Specifically, the unit electrode body 42m is provided with a plurality of sub electrodes 42w and a combining portion 42y. The plurality of sub electrodes 42w is extended in a Y axis direction. Adjacent sub electrodes 42w are separated at a predetermined interval. One end of each of the plurality of sub electrodes 42w is connected to the combining portion 42y extended in the X axis direction.

Figure 4B:
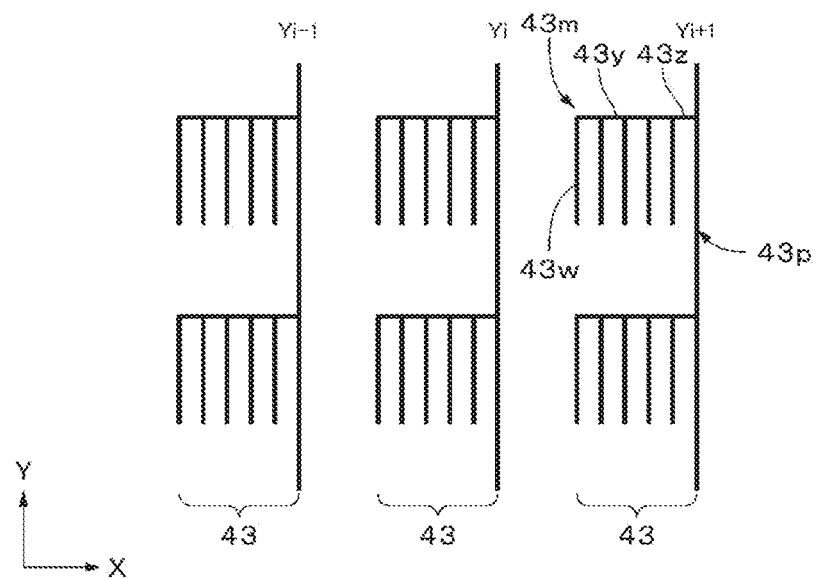
FIG. 4B is a plan view showing a configuration example of a Y electrode.

As shown in FIG. 4B, the Y electrode 43 as a second electrode is provided with an electrode line portion 43p, a plurality of unit electrode bodies 43m, and a plurality of connection portions 43z. The electrode line portion 43p is extended in the Y axis direction. The plurality of unit electrode bodies 43m is disposed at constant intervals in the Y axis direction. The electrode line portion 43p and the unit electrode bodies 43m are separated at a predetermined interval, and are connected by the connection portions 43z.

The unit electrode bodies 43m has a comb-like shape as a whole. Specifically, the unit electrode body 43m is provided with a plurality of sub electrodes 43w and a combining portion 43y. The plurality of sub electrodes 43w is extended in the Y axis direction. Adjacent sub electrodes 43w are separated at a predetermined interval. One end of each of the plurality of sub electrodes 43w is connected to the combining portion 43y extended in the X axis direction.

Figure 5A:
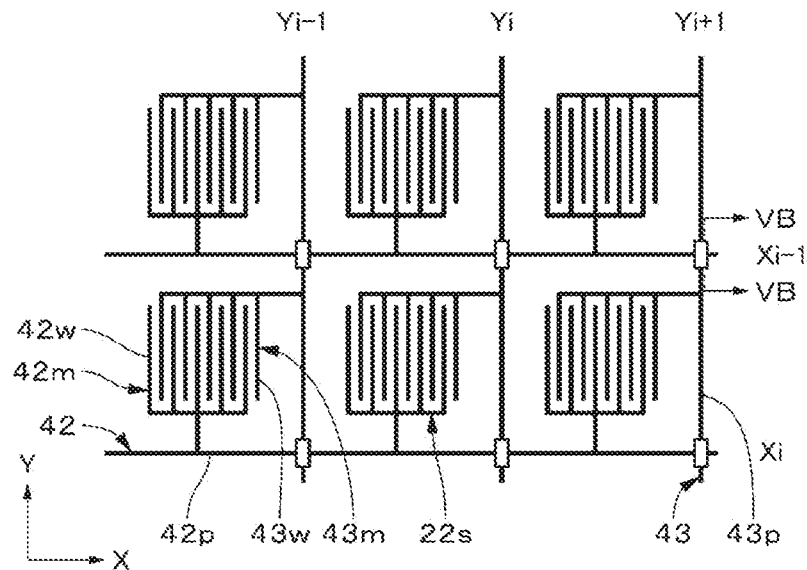
FIG. 5A is a plan view showing an arrangement example of the X and Y electrodes.

As shown in FIG. 5A, the plurality of sub electrodes 42w of the unit electrode body 42m and the plurality of sub electrodes 43w of the unit electrode body 43m are alternately disposed in the X axis direction. The sub electrodes 42w and 43W are separated at predetermined intervals. When a voltage is applied between the X and Y electrodes 42 and 43, the sub electrodes 42w and 43w that are adjacent in an in-plane direction of the base material 41 form a capacitive coupling. In a state in which the voltage is applied between the X and Y electrodes 42 and 43, when the reference electrode layer 25 approaches the sensor layer 22 (that is, detection units 22s) by an input operation, a capacitance between the adjacent sub electrodes 42w and 43w changes. Thus, a capacitance of the entire detection units 22s constituted of a set of unit electrode bodies 42m and 43m changes. On the basis of the change in capacitance of the entire detection units 22s, the controller IC 14 determines which of the gesture and key input operations is performed with respect to the operation surface.

Figure 5B:
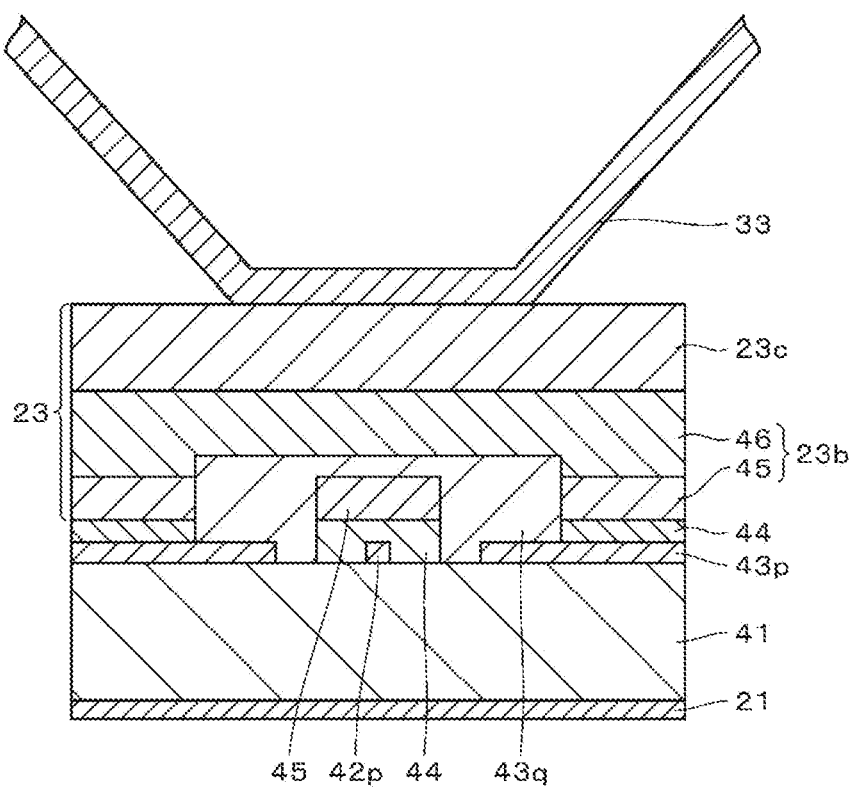
FIG. 5B is a cross-sectional view taken along the line VB-VB of FIG. 5A.

As shown in FIG. 5B, on the electrode line portion 42p of the X electrode 42, the insulation layer 44 and an insulation layer 45 are provided, and a jumper wiring 43q is provided in such a manner that the jumper wiring strides over the insulation layers 54 and 55, and end portions of the electrode line portions 43p are electrically connected. On the jumper wiring 43q, an insulation layer 56, an adhesive layer 23c is laminated. The X and Y electrodes 42 and 43 are covered with the insulation layer 44 as shown in FIG. 3.

(Structure)

The plurality of structures 24 is each provided with a protruded portion 31 and a pressure body 32 disposed on a top portion 31a of the protruded portion 31. The plurality of structures 24 is disposed between the reference electrode layer 25 and the intermediate layer 23. By the plurality of structures 24, the reference electrode layer 25 and the intermediate layer 23 are separated, thereby forming a predetermined space. The protruded portion 31 is configured by an embossed layer 33 as an uneven layer. The protruded portion 31 is a protruded part of the embossed layer 33 as the uneven layer which is disposed on a front surface of the intermediate layer 23. A back surface side of the protruded portion 31 is depressed, and the inside of the protruded portion 31 is hollow. Between the protruded portions 31, a flat portion 34 is provided. The flat portion 34 is bonded to the intermediate layer 23, for example, with the result that the plurality of structure layers 24 is fixed to the front surface of the intermediate layer 23. A plurality of keys 26a included in the key top layer 26 is respectively disposed on the plurality of structures 24.

As the embossed layer 33, an embossed film is desirably used. As a material of the film, for example, a polymer resin material can be used. Examples of the polymer resin material include polyethylene terephthalate (PET), polyethylene naphthalate (PEN), polycarbonate (PC), acrylic resin (PMMA), polyimide (PI), triacetylcellulose (TAC), polyester, polyamide (PA), aramid, polyethylene (PE), polyacrylate, polyether sulfone, polysulfone, polypropylene (PP), diacetyl cellulose, polyvinyl chloride, epoxy resin, urea resin, urethane resin, melamine resin, cyclic olefin polymer (COP), and norbornene-based thermoplastic resin.

The protruded portion 31 is a reaction force structure, the reaction force of which is nonlinearly changed with respect to the pressing amount (with respect to an operation load). The protruded portion 31 is provided with the top portion 31a and a buckling portion 31b. It is desirable that the shape of the protruded portion 31 be a conical frustum or a square pyramid frustum. Having the shape can keep a height thereof to be lower as compared to the case of having a dome shape. With an angle of the bucking portion 31b, a thickness of the protruded portion 31 (that is, thickness of embossed layer 33), a size of the protruded portion 31, or the like, it is possible to adjust an operation load and a click rate. For example, the angle of the buckling portion 31b is set to 15 degrees or less, desirably, 4 to 7.5 degrees (inclusive). For example, the thickness of the protruded portion 31 is 50 μm to 100 μm (inclusive). For example, the size (diameter) φ of the protruded portion 31 is 10 mm. The height of the protruded portion 31 is 200 μm, for example. It is desirable that the thickness of the pressure body 32 be equal to or thicker than the intermediate layer 23, for example, 100 μm to 200 μm (inclusive).

The pressure body 32 is a two-sided adhesive film, for example, and is provided with a resin layer 32a and adhesive layers 32b and 32c which are provided on both sides of the resin layer 32a, respectively. The pressure bodies 32 is bonded to the front surface of the top portion 31a of the protruded portions 42 through the adhesive layer 32b and is bonded to the back surface of the reference electrode layer 25 through the adhesive layer 32c.

Figure 6A:
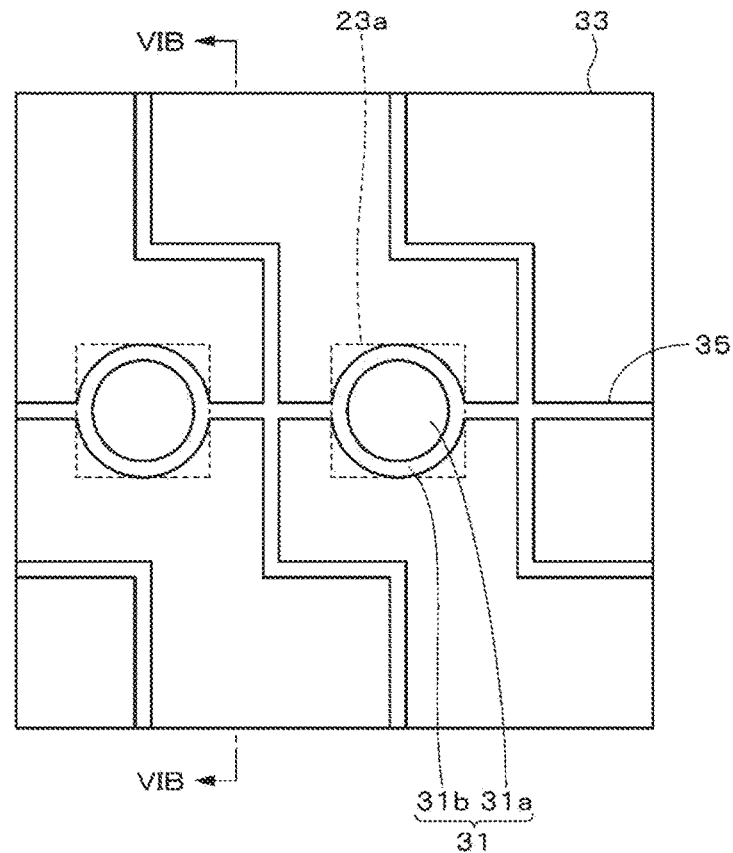
FIG. 6A is a top view showing a configuration example of the sensor module in a state in which a key top layer, the reference electrode layer, and a pressure body are excluded.
Figure 6B:
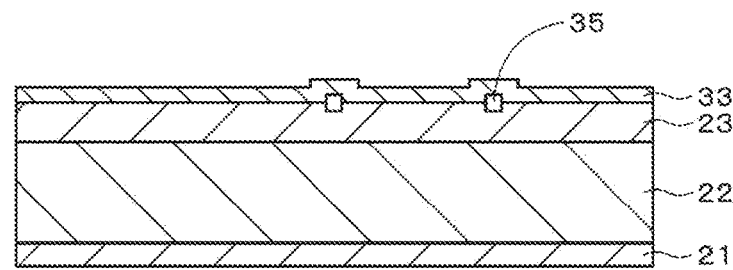
FIG. 6B is a cross-sectional view taken along the line VIB-VIB of FIG. 6A.

As shown in FIG. 6A, the embossed layer 33 has a vent 35. By the vent 35, adjacent protruded portions 31 are connected. Through the vent 35, air in the inside space of the structure 24 is discharged when the structure 24 is pressed. As shown in FIG. 6B, the vent 35 is a hole portion formed by a groove formed on the back surface of the embossed layer 33 and the front surface of the intermediate layer. On the front surface of the intermediate layer 23, a part that faces the groove of the embossed layer 33 may also have a groove, and the groove on the back surface of the embossed layer 33 and the groove on the front surface of the intermediate layer 23 may be combined, thereby forming the vent 35.

(Intermediate Layer)

The intermediate layer 23 is provided with a main body layer 23b of the intermediate layer 23 and the adhesive layer 23c formed on the front surface of the main body layer 23b. Further, the intermediate layer 23 has a plurality of hole portions 23a. For example, the hole portions 23a are through holes that penetrate the intermediate layer 23 from the front surface to the back surface, for example. The plurality of hole portions 23a is formed immediately below the plurality of structures 24, respectively. That is, when viewed in a direction vertical to the front surface of the intermediate layer 23, the plurality of hole portions 23a is formed on such positions as to coincide with the plurality of structures 24, respectively. As a result, in the case where the key input operation is performed, the top portion 31a of the protruded portion 31 can be inverted to enter the hole portion 23a. The intermediate layer 23 is configured by screen print, a molded film, or the like, for example. The thickness of the intermediate layer 23 is 100 μm, for example.

It is desirable that an inner circumference of the protruded portion 31 on a bottom portion side thereof be in substantially contact with an outer circumference of the hole portion 23a of the intermediate layer 23. More specifically, for example, in the case where the hole portion 23a of the intermediate layer 23 has a square outer circumference, and the protruded portion 31 has the conical frustum shape, it is desirable that the inner circumference of the bottom portion of the protruded portion 31 be in substantially in contact with the outer circumference of the hole portion 23a of the intermediate layer 23.

When the protruded portion 31 is inverted, an abrupt change in reaction force is caused. In the state in which the embossed layer 33 is fixed to the intermediate layer 23, in order to invert the protruded portion 31, that is, to switch a vertical positional relationship between the top portion and the bottom portion of the protruded portion 31, it is desirable that the hole portion 23a have a depth to some extent. It is desirable that a thickness T1 of the pressure body 32 be equal to or more than a thickness T2 of the intermediate layer 23, that is, the depth of the hole portion 23a. This is because the configuration improves the sense of click. Further, it is desirable that the depth of the hole portion 23a be equal to or less than the height of the protruded portion 31. In the case where the depth of the hole portion exceeds the height of the protruded portion 31, there is a fear that the protruded portion 31 may not be returned after being inverted.

As shown in FIG. 5B, the intermediate layer 23 is constituted of the insulation layers 45 and 46 laminated on the insulation layer 44 and the adhesive layer 23c. The intermediate layer 23 and the embossed layer 33 are bonded with each other through the adhesive layer 23c. The main body layer 23b of the intermediate layer 23 is constituted of the insulation layers 45 and 46.

(Key Top Layer)

As the key top layer 26, for example, a resin film, a metal plate having flexibility, or the like can be used. On the front surface (surface as an input side) of the key top layer 26, a plurality of keys 26a is arranged. On the key 26a, a character, a symbol, a function, or the like is printed. By pressing or releasing the key 26a, information such as a scancode is output from the controller IC 14 to the host 12.

(Controller IC)

On the basis of an electrical signal depending on a change in capacitance, which is supplied from the sensor module 20, the controller IC 14 determines which of the gesture and key input operations is performed for the operation surface, and outputs information corresponding to a determination result to the host 12. Specifically, the controller IC 14 has two threshold values A and B, and performs the determination described above on the basis of the threshold values A and B. For example, when it is determined that the gesture input operation is performed, coordinate information is output to the host 12. Further, when it is determined that the key input operation is performed, information relating to a key such as a scancode to the host 12.

[Operation of Sensor Module]

Hereinafter, with reference to FIG. 7A and FIG. 7B, a description will be given on an operation example of a sensor module 120 at the time of the gesture and key input operations.

(Gesture Input Operation)

Figure 7A:
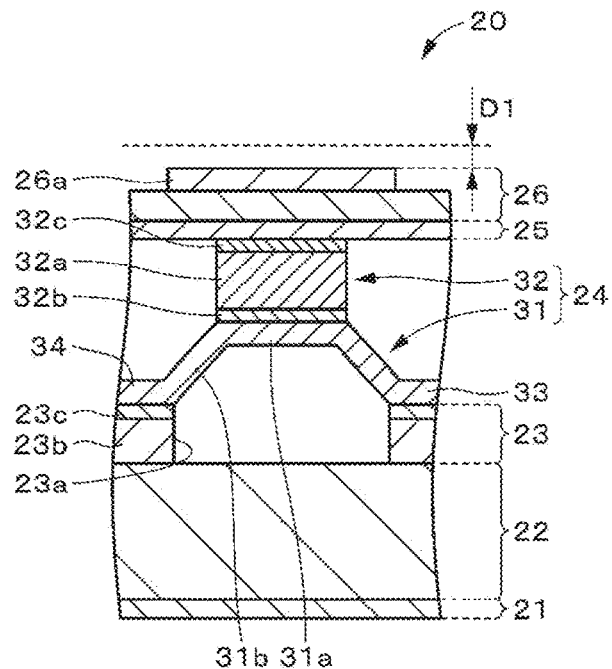
FIG. 7A is a cross-sectional view for explaining an operation example of the sensor module at a time when a gesture input operation is performed.

When the gesture input operation is performed for the front surface (operation surface) of the sensor module 20, as shown in FIG. 7A, the structure 24 is slightly deformed and is shifted downwards from an initial position by a distance D1. As a result, a distance between the sensor layer 22 and the reference electrode layer 25 is slightly changed by the distance D1, and the capacitance between the unit electrode bodies 42m and 43m is slightly changed. By the detection units 22s in the sensor layer 22, the electrostatic capacitance change is detected and output to the controller IC 14 as the electrical signal.

(Key Input Operation)

Figure 7B:
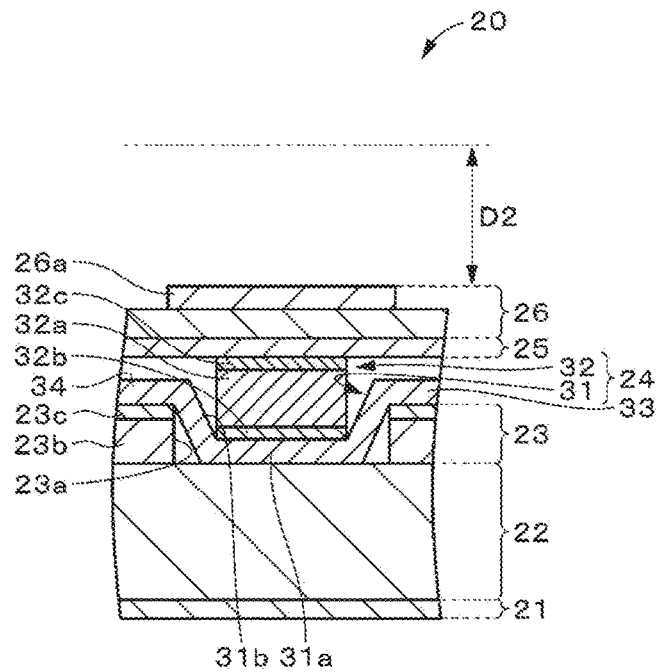
FIG. 7B is a cross-sectional view for explaining an operation example of the sensor module at a time when a key input operation is performed.

By performing a key input operation for a front surface (operation surface) of the sensor module 20, as shown in FIG. 7B, the protruded portion 31 is inverted and shifted from an initial position by a distance D2. As a result, the distance between the sensor layer 22 and the reference electrode layer 25 is largely changed by the distance D2, and the capacitance between the unit electrode bodies 42m and 43m is largely changed. By the detection units 22s in the sensor layer 22, the electrostatic capacitance change is detected and output to the controller IC 14 as the electrical signal.

[Change In Reaction Force and Capacitance with Respect to Pressing of Structure]

In the sensor module 20 having the configuration described above, as shown in FIG. 8A, the structure 24 has such a function that the reaction force to the operator is nonlinearly changed with respect to the movement amount of the reference electrode layer 25. Specifically, the structure 24 has such a function that the reaction force is increased in response to pressing by the operator up to the maximum value of P1, is decreased to a minimum value of P2 by further increasing the pressing amount, and is increased again by further pressing to a limit point of pressing deformation.

Figure 8A:
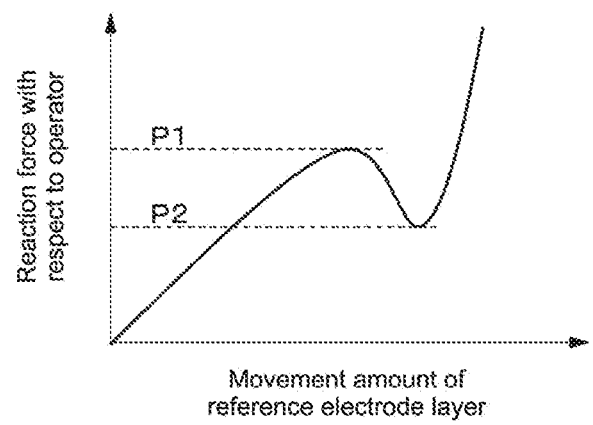
FIG. 8A is a graph showing a relationship between a movement amount of a reference electrode and a reaction force to an operator.
Figure 8B:
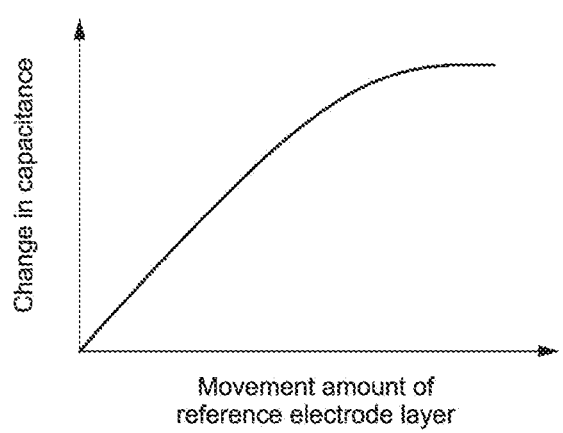
FIG. 8B is a graph showing a relationship between the movement amount of the reference electrode and a capacitance change.
Figure 8C:
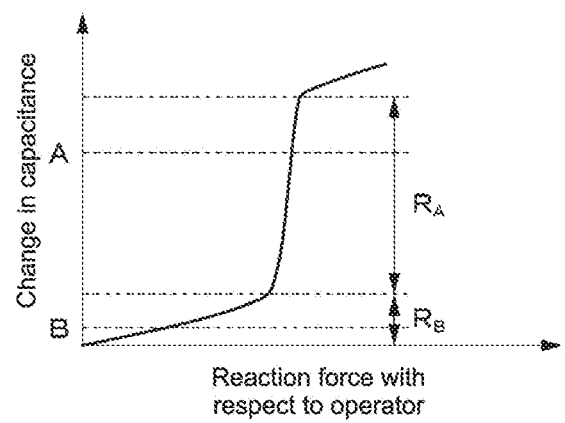
FIG. 8C is a graph showing a relationship between the reaction force with respect to the operator and the capacitance change.
Figure 9:
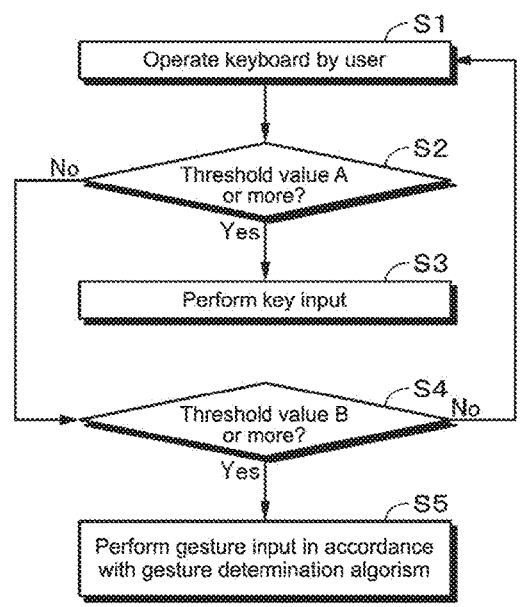
FIG. 9 is a flowchart for explaining an operation example of a controller IC.

In the sensor module 20, the electrostatic capacitance change is monotonously increased with respect to the movement amount of the reference electrode layer 25 as shown in FIG. 8B. Further, as shown in FIG. 8C, the electrostatic capacitance is gradually changed in accordance with an increase in reaction force to the operator, is abruptly changed, and is then gradually changed again. In FIG. 8A, an area $R_B$ where the electrostatic capacitance is gradually changed first corresponds to an area from when the operator starts pressing from the initial position until the reaction force reaches the maximum value P1. Further, in FIG. 8A, an area $R_A$ where the electrostatic capacitance is abruptly changed corresponds to an area where the reaction force reaches the minimum value P2 from the maximum value P1.

A threshold value A is set in the area $R_A$, and whether the capacitance exceeds the threshold value A or not is determined, with the result that it is possible to determine whether the key input operation is performed for the operation surface or not. On the other hand, a threshold value B is set in the area $R_B$, and whether the capacitance exceeds the threshold value B or not is determined, with the result that it is possible to determine whether the gesture operation is performed for the operation surface or not.

[Operation of Controller IC]

Hereinafter, with reference to FIGS. 12A, 12B, 12C and 12D, a description will be given on an example of the operation of the controller IC 14.

First, in Step 51, when a user performs an input operation for the operation surface of the keyboard 11, in Step S2, on the basis of the electrical signal depending on the change in capacitance, which is supplied from the sensor module 20, the controller IC 14 determines whether the electrostatic capacitance change is equal to or more than the threshold value A or not. In the case where it is determined that the electrostatic capacitance change is equal to or more than the threshold value A in in Step S2, in Step S3, the controller IC 14 outputs information relating to the key such as a scancode to the host 12. As a result, a key input is performed. On the other hand, in Step S2, in the case where it is determined that the electrostatic capacitance change is not equal to or more than the threshold value A, the process proceeds to Step S4.

Subsequently, in Step S4, on the basis of the electrical signal depending on the change in capacitance, which is supplied from the sensor module 20, the controller IC 14 determines whether the electrostatic capacitance change is equal to or more than the threshold value B or not. In the case where it is determined that the electrostatic capacitance change is equal to or more than the threshold value B in Step S4, in Step S5, the controller IC 14 operates in accordance with a gesture determination algorism. As a result, the gesture input is performed. On the other hand, in the case where it is determined that the electrostatic capacitance change is not equal to or more than the threshold value B in Step S4, the process returns to Step S1.

[Effect]

In the electronic apparatus 10 according to the first embodiment, for the operation surface of the keyboard 11, two functions of a key input and a gesture cursor operation can be provided. As a result, it is possible to implement a keyboard function and a touchpad function in a small area. Further, it is possible to perform the gesture input after the key input without moving a hand to a large extent, resulting in an improvement of usability. Further, the great sense of click and stroke can be obtained even with a thin structure.

[Modified Examples]

(Modified Example 1)

In the first embodiment, described above, as shown in FIGS. 2A and 2B, the example is described in which the protruded portion 31 is provided with the pressure body 32 on the top portion 31a thereof, but the configuration of the protruded portion 31 is not limited to this example. Hereinafter, a description will be given on an example in which stiffness of the top portion 31a of the protruded portion 31 is increased, with the result that the sense of click can be improved, and an operation load can be increased.

Figure 10A:
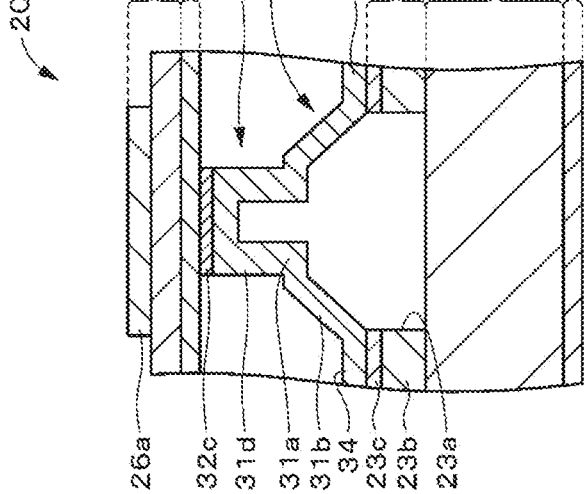
FIG. 10A and FIG. 10B are cross-sectional views each showing a configuration example of a sensor module according to a modified example 1 of the first embodiment of the present technology.

As shown in FIG. 10A, a thick film portion 31c obtained by increasing the thickness of the top portion 31a of the protruded portion 31 so as to be thicker than a thickness of the buckling portion 31b may be provided. The thick film portion 31c is bonded to the reference electrode layer 25 through an adhesive layer 32c. In this case, the thick film portion 31c and the adhesive layer 32c constitute the pressure body 32. In the case of the configuration described above, as the embossed layer 33, for example, an embossed film having a part corresponding to the top portion 31a which is thicker than a remaining part is used. The embossed film can be formed by melt molding, for example.

Figure 10B:
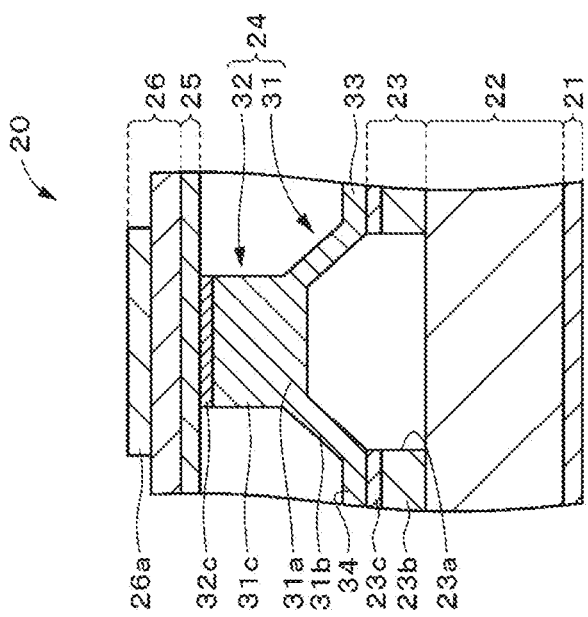

As shown in FIG. 10B, the protruded portion 31 may be provided with a shaped portion 31d obtained by deforming the top portion 31a into a protruded shape. The shaped portion 31d is bonded to the reference electrode layer 25 through the adhesive layer 32c. In this case, the shaped portion 31d and the adhesive layer 32c constitute the pressure body 32. In the configuration described above, it is desirable that the protruded portion 31 have a conical frustum shape. shaped portion 31d. For example, a shape obtained by causing the top portion of the protruded portion 31 to be protruded partially or entirely uniformly or a shape obtained by depressing the center of the shape may be used. From a viewpoint of improving the sense of click, the former shape is desirable. More specifically, as the shape of shaped portion 31d, a columnar shape such as a cylindrical shape and a polygonal columnar shape or a shape obtained by depressing the center of those can be used. From a viewpoint of an improvement of the sense of click, the columnar shape such as a cylindrical shape and a polygonal columnar shape is desirable. It is desirable that the shaped portion 31d be formed by embossing at the same time when the protruded portion 31.

If the stiffness of the top portion 31a of the protruded portion 31 is small, deformation occurs at that portion, which hinders stress concentration on a part which is desired to be clicked. As a result, there is a fear that it may be impossible to obtain a clear click. When a stiff, thick material is bonded onto the top portion 31a of the protruded portion 31 to form the pressure body 32, an improvement of tactile impression may be obtained, but this configuration may cause an increase in cost. In contrast, in the case where the shaped portion 31d is formed onto the top portion 31a of the protruded portion 31 by molding to increase the stiffness, it is possible to improve the tactile impression without causing an increase in cost.

In the first embodiment, the resin layer 32a may be made of a material having high stiffness, for example, a material having higher stiffness than the material of the embossed layer 33.

(Modified Example 2)

Figure 11:
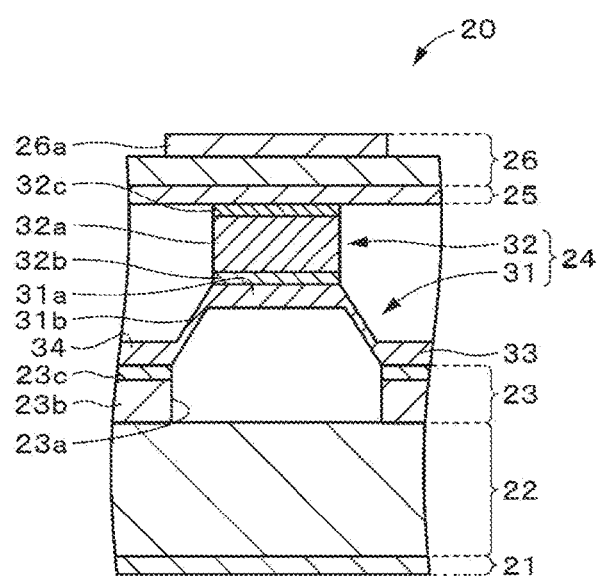
FIG. 11 is a cross-sectional view showing a configuration example of a sensor module according to a modified example 2 of the first embodiment of the present technology.

As shown in FIG. 11, the thickness of the buckling portion 31b may be less than the thickness of the top portion 31a.

Figure 12A:
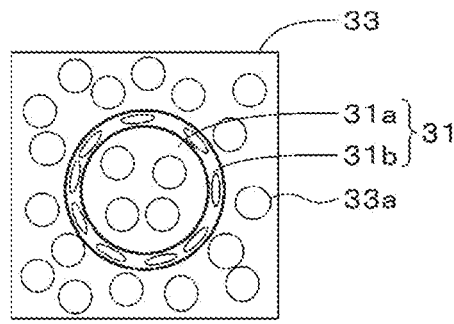
FIG. 12A, FIG. 12B, FIG. 12C, and FIG. 12D are plan views each showing a configuration example of an embossed layer of the sensor module according to the modified example 2 of the first embodiment of the present technology.
Figure 12B:
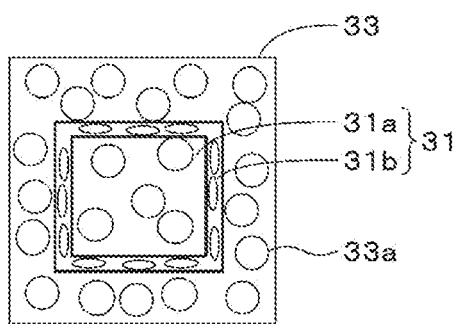

As shown in FIG. 12A and FIG. 12B, a large number of hole portions 33a may be formed in the embossed layer 33. FIG. 12A shows an example in which the large number of hole portions 33a are formed in the embossed layer 33 on which the protruded portion 31 having the conical frustum shape is formed. FIG. 12B shows an example in which the large number of hole portions 33a are formed in the embossed layer 33 on which the protruded portion 31 having a pyramid frustum. From a viewpoint of adjusting an operation load, it is desirable that the large number of hole portions 33a be formed in the buckling portion 31b.

Figure 12C:
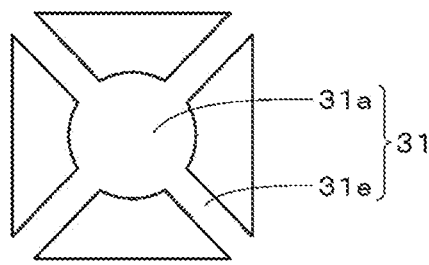
Figure 12D:
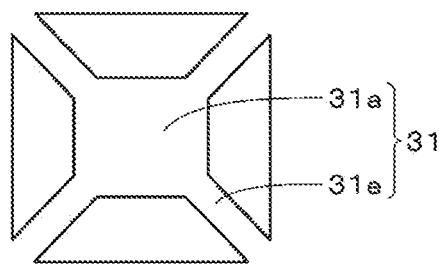

As shown in FIG. 12C and 12D, the buckling portion may be partially cut out, and the buckling portion may be constituted of a plurality of leg portions 31e, for example. FIG. 12C shows an example in which for the top portion 31a having a circular shape, the plurality of leg portions 31e is provided. FIG. 12D shows an example in which for the top portion 31a having a square shape, the plurality of leg portions 31e is provided.

By using the configuration in which the thickness of the buckling portion 31b is reduced, the configuration in which the large number of hole portions 33a are formed in the embossed layer 33, or the configuration in which the buckling portion is constituted of the plurality of leg portions 31e described above, it is possible to reduce the weight of the sensor module 20 and adjust the operation load. It should be noted that two or more of those configurations may be combined and used.

(Modified Example 3)

Figure 13:
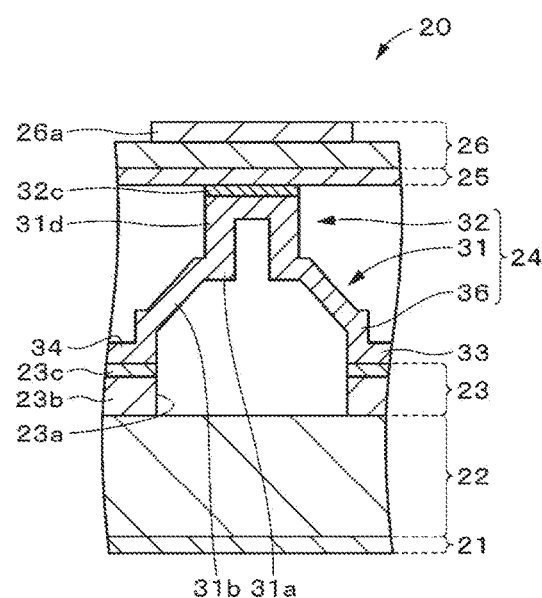
FIG. 13 is a cross-sectional view showing a configuration example of a sensor module according to a modified example 3 of the first embodiment of the present technology.
Figure 14A:
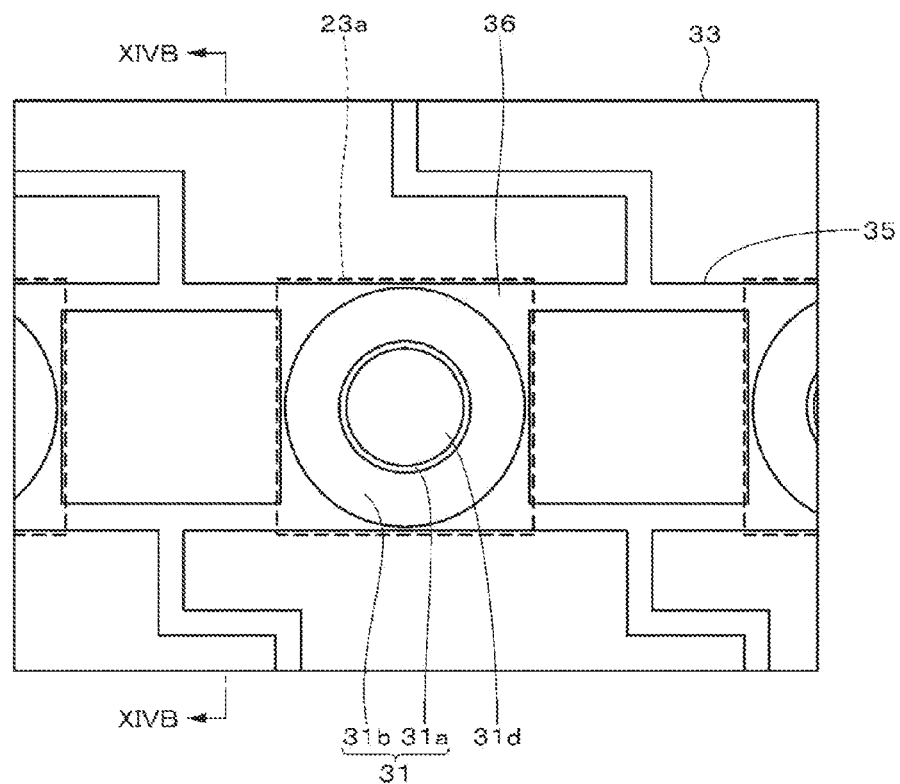
FIG. 14A is a top view showing a configuration example of the sensor module in a state in which a key top layer and a pressure body are excluded.
Figure 14B:
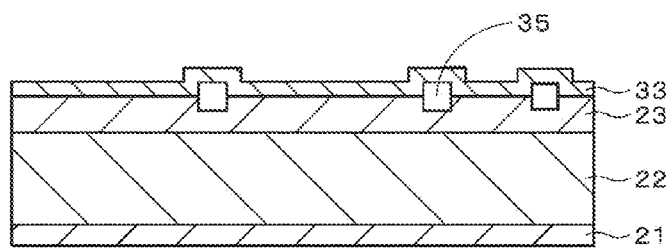
FIG. 14B is a cross-sectional view taken along the line XIVB-XIVB of FIG. 14A.

As shown in FIG. 13, the structure 24 is provided with a base portion 36 having a side surface that is erected substantially vertically to the front surface of the intermediate layer 23 or a side surface tilted at a tilt angle of 90 degrees or less with respect to the front surface of the intermediate layer 23, and the protruded portion 31 disposed on the base portion 36 in such a manner that an outer circumference on a bottom portion side is substantially in contact with an outer circumference of the base portion 36. More specifically, the structure 24 is provided with the base portion 36 having the side surface erected substantially vertically to the front surface of the intermediate layer 23 or the side surface tilted at the tilt angle of 90 degrees or less with respect to the front surface the intermediate layer 23 and having a square outer circumference, and the protruded portion 31 having the conical frustum shape formed on the base portion 36. With this configuration, deformation can be caused on corner portions of the base portion 36, so the sense of click is improved. It is desirable that the outer circumference of the protruded portion 31 on the bottom portion side be substantially in contact with the outer circumference of the base portion 36. This is because the configuration further improves the sense of click. As shown in FIG. 14A and FIG. 14B, the vent 35 is provided on a side surface of the base portion 36.

In the case where the intermediate layer 23 is configured by an insulation layer and an adhesive, when those are formed to be thick by printing or the like, there is a fear that an increase in cost may be caused due to a material cost, the number of prints, or the like. In the configuration according to the modified example 3 described above, by providing the base portion 36, the thickness of the intermediate layer 23 can be reduced, and thus the cost can be reduced.

(Modified Example 4)

Figure 15A:
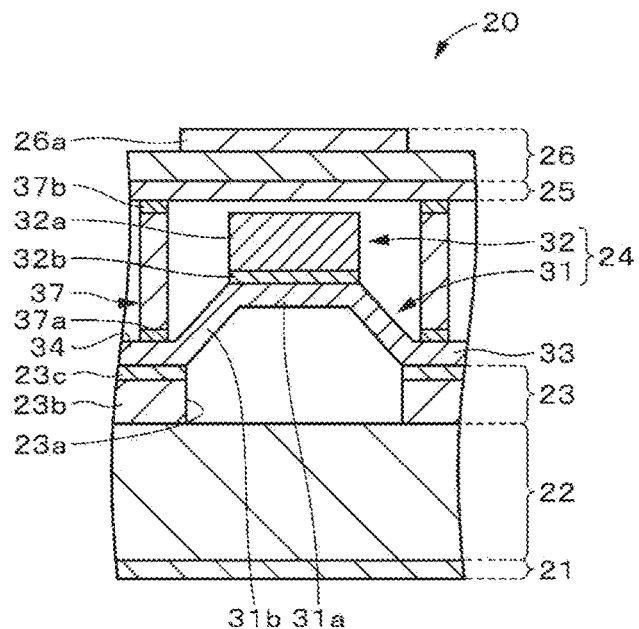
FIG. 15A and FIG. 15B are cross-sectional views each showing a configuration example of the sensor module according to a modified example 4 of the first embodiment of the present technology.

As shown in FIG. 15A, a plurality of support bodies 37 that supports the reference electrode layer 25 may be provided on a front surface of a flat portion 34. By the support bodies 37, the reference electrode layer 25 and the intermediate layer 23 are separated, thereby forming a predetermined space. The support bodies 37 may be wall portions continuously formed around the structures 24 or may be columnar bodies discontinuously formed so as to be separated at predetermined intervals. On lower ends of the support bodies 37, an adhesive layer 37a may be formed, and through the adhesive layer 37a, the support bodies 37 may be bonded to a front surface of the flat portion 34. Further, on upper ends of the support bodies 37, an adhesive layer 37b is formed, and through the adhesive layer 37b, the support bodies 37 may be bonded to a back surface of the reference electrode layer 25. As a material of the support body 37, for example, a polymer resin material is used. As the polymer resin material, it is desirable that a light curable resin such as an ultraviolet curable resin be used. An elastic modulus of the support bodies 37 is not particularly limited, and can be selected appropriately within a range in which an intended detection sensitivity or the like can be obtained.

Figure 15B:
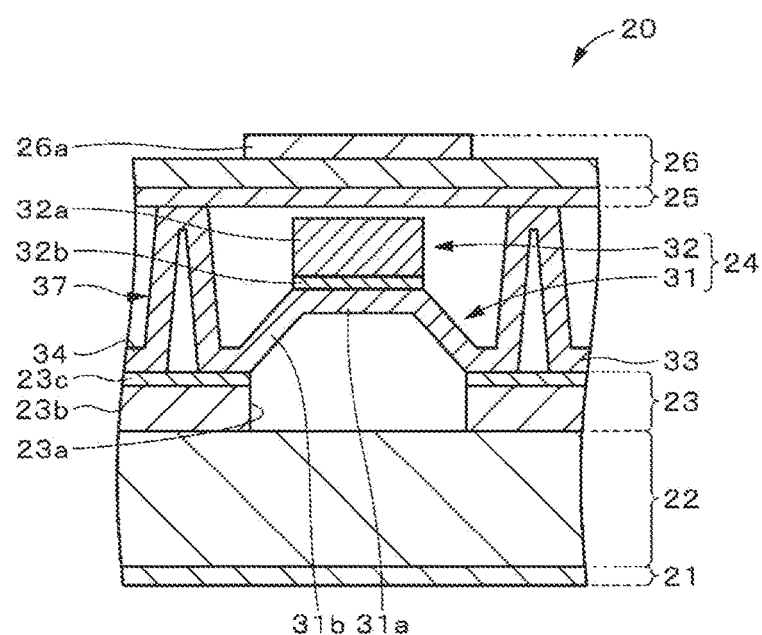

As shown in FIG. 15B, the support bodies 37 may be configured as a part of the embossed layer 33 such as an embossed film. In this case, the support bodies 37 may be formed by embossing at the same time when the protruded portion 31 is formed.

It is desirable that the support body 37 be higher than the structure 24. Thus, it is possible to separate the pressure body 32 of the protruded portion 31 and the reference electrode layer 25, and the predetermined space can be formed. By forming the space, at a time of performing a gesture input operation with a low load, only a reaction force of the support bodies 37 can operate, and at a time of performing a key input operation with a high load, a reaction force of the structure 24 can also operate. As a result, a gesture operation with high sensitivity can be achieved.

(Modified Example 5)

In the first embodiment described above, the description is given on the configuration in which the X and Y electrodes are disposed on the same plane of the base material as an example. However, the configuration of the X and Y electrodes is not limited to this example. For example, a configuration may be used in which striped X and Y electrodes are separated at predetermined intervals so as to be orthogonally crossed. In this case, the X and Y electrodes may be long, thin rectangular electrodes or may be electrodes constituted of a plurality of linear electrode elements.

(Modified Example 6)

Figure 25A:
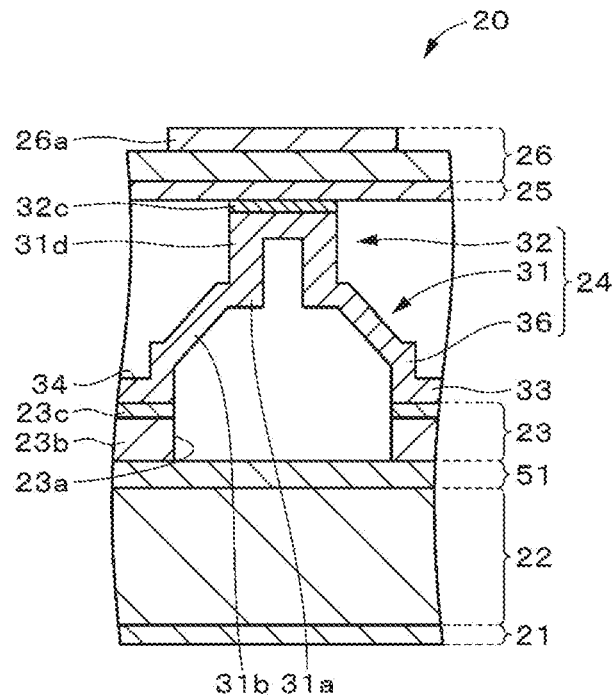
FIG. 25A is a cross-sectional view showing a configuration example of a sensor module according to a modified example 6 of the first embodiment of the present technology.

As shown in FIG. 25A, the sensor module 20 may be further provided with a base layer 51 disposed between the sensor layer 22 and the intermediate layer 23. The base layer 51 is not bonded onto the sensor layer 22 as a lower layer thereof by an adhesive layer or the like, but is only placed thereon. Further, the base layer 51 has the same or substantially the same linear expansion coefficient as the embossed layer 33. The base layer 51 and the embossed layer 33 may be made of the same material or different materials having the same or substantially the same linear expansion coefficient.

The base layer 51 is a film, and on a front surface of the film, the intermediate layer 23 is directly provided. As a material of the film, it is possible to use a material similar to that of the embossed layer 33. It should be noted that the base layer 51 may be a one-side adhesive film provided with a resin layer as a film and an adhesive layer disposed on a front surface of the resin layer, and through the adhesive layer, the base layer 51 and the intermediate layer 23 may be bonded to each other. In this case, the linear expansion coefficient of the base layer 51 means a linear expansion coefficient of the resin layer as the film.

In the sensor module 20 according to the modified example 6, the base layer 51 having the configuration described above is further provided between the sensor layer 22 and the intermediate layer 23. Thus, even in the case where the sensor layer 22 and the embossed layer 33 are extended or contracted due to a change in environmental temperature or the like in an in-plane direction of the sensor layer 22, it is possible to suppress the generation of distortion or the like in members that constitute the sensor module 20. Accordingly, it is possible to increase the reliability of the sensor module 20.

(Modified Example 7)

Figure 25B:
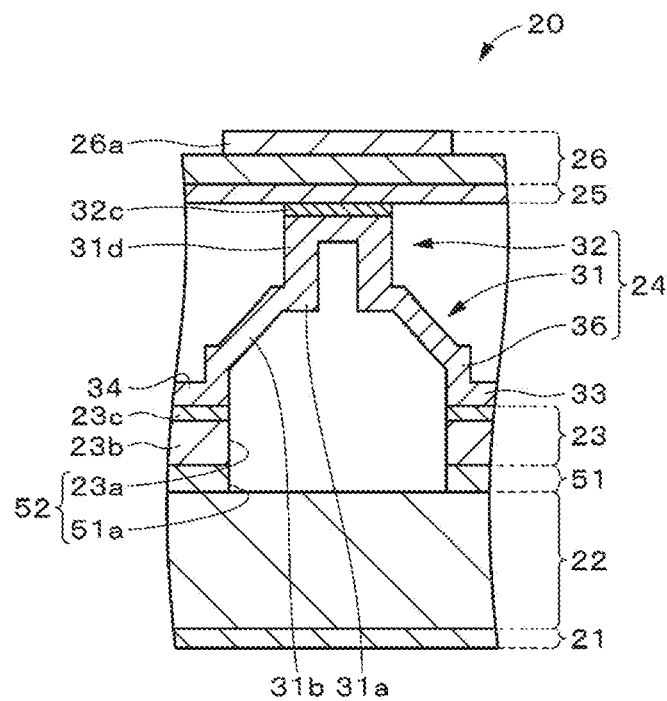
FIG. 25B is a cross-sectional view showing a configuration example of a sensor module according to a modified example 7 of the first embodiment of the present technology.

As shown in FIG. 25B, the base layer 51 may include a plurality of hole portions 51*a* into which the top portion 31*a* of the protruded portion 31 can be pressed. The hole portions 51*a* are through holes that penetrate the base layer 51 from the front surface thereof to the back surface thereof. The plurality of hole portions 51*a* is directly below the plurality of structures 24. That is, when viewed in a direction vertical to the front surface (operation surface) of the sensor module 20, the hole portions 23*a* and 51*a* are formed on a superposed position. The hole portion 51*a* of the base layer 51 and the hole portion 23*a* of the intermediate layer 23 constitute one hole portion 52. Accordingly, in the case where the key input operation is performed, the top portion 31*a* of the protruded portion 31 is inverted and thus can enter the hole portion 52. It should be noted that the hole portions 23*a* and 51*a* only have to allow the top portion 31*a* of the protruded portion 31 to enter the hole portions as described above, and may not have the same shape and size.

In the sensor module 20 in the modified example 7, in the base layer 51, the plurality of hole portions 51*a* is provided, and the hole portion 51*a* of the base layer 51 and the hole portion 23*a* of the intermediate layer 23 constitute the one hole portion 52. Thus, it is possible to improve the sense of stroke, that is, the sense of typing without increasing a total thickness of the sensor module 20 due to providing of the base layer 51.

It should be noted that the main body layer 23*b* of the intermediate layer 23 may be configured by a film similar to the base layer 51. In this case, it is possible to obtain a similar effect as above without providing the base layer 51.

(Modified Example 8)

In the first embodiment, the base material 41 (see FIG. 3 and FIG. 5B) included in the sensor layer 22 may have the same or substantially the same linear expansion coefficient as the embossed layer 33. In this case, it is possible to increase the reliability of the sensor module 20 as in the modified example 6.

(Modified Example 9)

Figure 26:
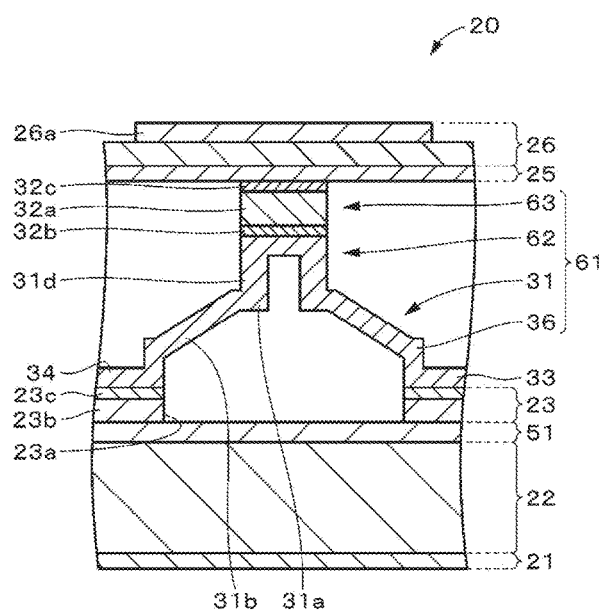
FIG. 26 is a cross-sectional view showing a configuration example of a sensor module according to a modified example 9 of the first embodiment of the present technology.

As shown in FIG. 26A, a structure 61 may be provided with two pressure bodies 62 and 63 on the top portion 31*a* of the protruded portion 31. The pressure body 63 as a second pressure body is disposed on the pressure body 62 as a first pressure body.

The pressure body 62 is the shaped portion 31*d*, for example. The pressure body 63 is an adhesive film, for example. For example, the adhesive film is a two-sided adhesive film provided with the resin layer 32*a* as the film and the adhesive layers 32*b* and 32*c* provided on both sides of the resin layer, respectively. The pressure body 63 is bonded on the front surface of the top portion of the shaped portion 31*d* through the adhesive layer 32*b* and is bonded on the back surface of the reference electrode layer 25 through the adhesive layer 32*c*. The pressure body 63 has the same or substantially the same size as the pressure body 62, for example.

In the sensor module 20 in the modified example 9, the two pressure bodies 62 and 39 are provided, so a click rate is improved. Further, the following effect can be obtained. The embossed layer 33 and the key top layer 26 are separated by a sufficient distance. Therefore, when the key 26*a* is pressed, it is possible to suppress the embossed layer 33 and the key top layer 26 from being in contact. It is possible to suppress the deformation of the key 26*a*. The elasticity of the key 26*a* by a deformation amount is not added, so the click rate is improved. A horizontal movement of the key 26*a* is obtained, with the result that a good feel can be obtained.

It should be noted that in the modified example 9 described above, the description is given on the case where the pressure body 62 as the first pressure body is the shaped portion 31*d* as an example. However, the pressure body 62 may be an adhesive film. The adhesive film is, for example, a one-side adhesive film provided with a resin layer as a film and an adhesive layer disposed on a back surface of the resin layer.

(Modified Example 10)

Figure 27:
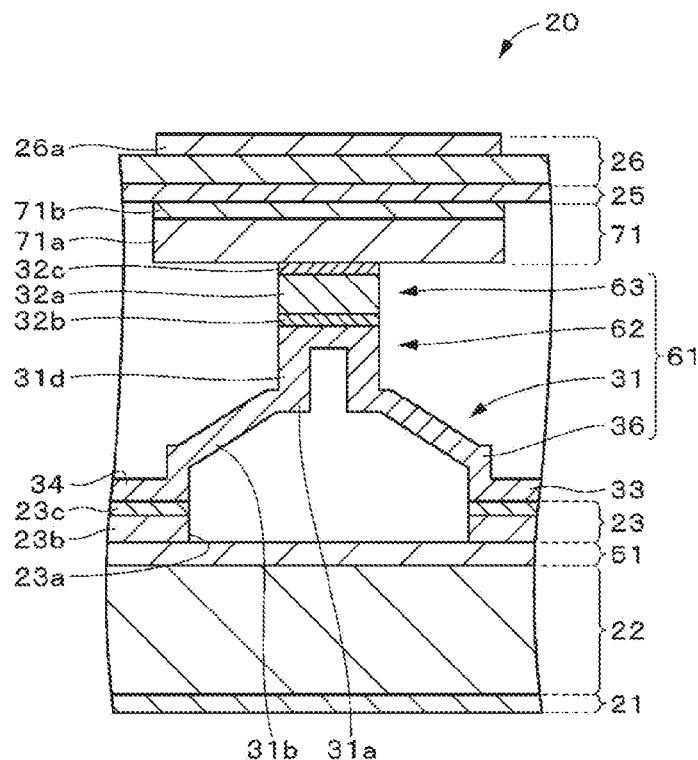
FIG. 27 is a cross-sectional view showing a configuration example of a sensor module according to a modified example 10 of the first embodiment of the present technology.

As shown in FIG. 27, the sensor module 20 may be further provided with a support layer 71 disposed between the structure 61 and the reference electrode layer 25. By using this configuration, it is possible to suppress a gritty feel of the structures 24 through the key top layer 26 when the front surface of the key top layer 26 is touched with a finger or the like.

It is desirable that the periphery of the support layer 71 be disposed on an outer side from the periphery of the pressure bodies 62 and 63 and on an inner side from the periphery of the key 26*a* when viewed from a direction vertical to the front surface (operation surface) of the sensor module 20, and it is more desirable that the periphery of the support layer 71 be disposed on an outer side from the periphery of a bottom portion of the structure 36 and on an inner side from the periphery of the key 26a. For example, the periphery of the support layer 71 is disposed so as to be superposed or substantially superposed on the periphery of the key 26a. By disposing the periphery of the support layer 71 on such a position, it is possible to further suppress the gritty feel of the structures 24 through the key top layer 26.

The support layer 71 is an adhesive film, for example. The adhesive film is a one-side adhesive film provided with a resin layer 71a as a film and an adhesive layer 71b provided on a front surface of the resin layer 71a. The support layer 71 is bonded on the back surface of the reference electrode layer 25 through the adhesive layer 71b. The pressure body 63 is bonded on the back surface of the support layer 71 through the adhesive layer 32c.

It should be noted that in the modified example 10, the description is given on the configuration in which the support layer 71 and the pressure body 63 are separated bodies as an example. However, the support layer 71 and the pressure body 63 may be integrally formed.

(Modified Example 11)

The sensor module may be provided with an embossed layer having a laminated structure with two or more layers. For the key operation area corresponding to a key, two or more protruded portions may be disposed, and the two or more protruded portions may be disposed so as to be separated in two or more layers. Further, the sensor module may be provided with an embossed layer with a single layer structure. For the key operation area corresponding to a key, two or more protruded portions may be disposed, and the two or more protruded portions may be disposed in an in-plane direction of the sensor layer. It should be noted that the key operation area means an area corresponding to an operation area of a key.

In the sensor module having the configuration described above, it is possible to increase an area where the sense of click can be generated, that is, an area where a reaction force is non-linearly changed with respect to a position pressed by an operator.

<2. Second Embodiment>

[Configuration of Sensor Module]

Figure 16:
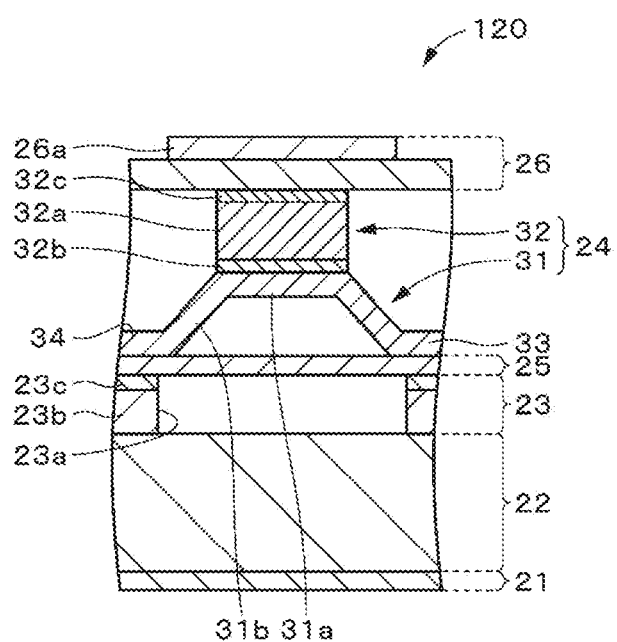
FIG. 16 is a cross-sectional view showing a configuration example of a sensor module according to a second embodiment of the present technology.

As shown in FIG. 16, a sensor module 120 according to a second embodiment of the present technology is different from the sensor module in the first embodiment in that between the intermediate layer 23 and the plurality of structures 24, that is, between the intermediate layer 23 and the embossed layer 33, the reference electrode layer 25 is provided. The structure 24 is disposed on the inside of the hole portion 23a of the intermediate layer 23 when viewed from a direction vertical to a front surface of the sensor module 120 (operation surface). More specifically, a lower portion of the buckling portion 31b of the protruded portion 31 is disposed on the inside of an outer circumference the hole portion 23a. The embossed layer 33 may be bonded to the reference electrode layer 25 through an adhesive layer or the like, or may be only placed on the reference electrode layer 25 without being bonded through the adhesive layer or the like.

[Operation of Sensor Module]

Hereinafter, with reference to FIG. 17A and FIG. 17B, a description will be given on an example of an operation of a sensor module 120 at a time of performing gesture and key input operations.

(Gesture Input Operation)

When a gesture input operation is performed for the front surface (operation surface) of the sensor module 120, as shown in FIG. 17A, the reference electrode layer 25 is pressed by the lower portion of buckling portion 31b of the protruded portion 31, a part of the reference electrode layer 25 which is positioned above a vicinity of the outer circumference of the hole portion 23a is slightly depressed into the hole portion 23a of the intermediate layer 23. As a result, a distance between the sensor layer 22 and the reference electrode layer 25 is changed by the distance D1, and the capacitance between the unit electrode bodies 42m and 43m is slightly changed. By the detection units 22s in the sensor layer 22, the electrostatic capacitance change is detected and output to the controller IC 14 as the electrical signal.

(Key Input Operation)

When the key input operation is performed for the front surface (operation surface) of the sensor module 120, as shown in FIG. 17B, the protruded portion 31 is inverted, and the reference electrode layer 25 is pressed to the top portion 31a thereof. A part positioned above the hole portion 23a in the reference electrode layer 25 is depressed into the hole portion 23a of the intermediate layer 23. At this time, the top portion 31a of the inverted protruded portion 31 may also be depressed into the hole portion 23a of the intermediate layer 23. As a result, the distance between the sensor layer 22 and the reference electrode layer 25 is largely changed by the distance D2, and the capacitance between the unit electrode bodies 42m and 43m is largely changed. By the detection units 22s in the sensor layer 22, the electrostatic capacitance change is detected and output to the controller IC 14 as the electrical signal.

[Effect]

In the sensor module 20 according to the first embodiment, the distance between the sensor layer 22 and the reference electrode layer 25 is demanded to be constant, so it is necessary to perform gap restriction in terms of a process. On the other hand, in the sensor module 120 according to the second embodiment, it is only necessary to bond the plurality of structures 24 and the like on the reference electrode layer 25, so the gap restriction is unnecessary to make the process simple. In addition, the height of a key, that is, the height of the structure 24 is easily obtained without increasing a layer thickness.

[Modified Examples]

(Modified Example 1)

Figure 18A:
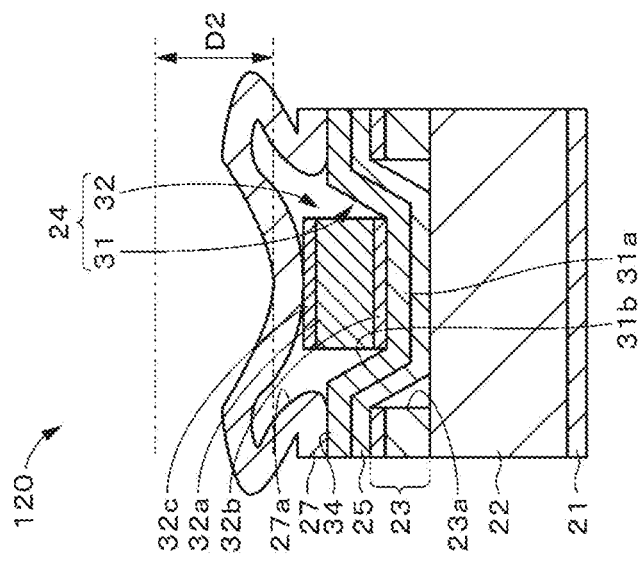
FIG. 18A is a plan view showing a configuration example of a sensor module according to a modified example 1 of the second embodiment of the present technology.
Figure 18B:
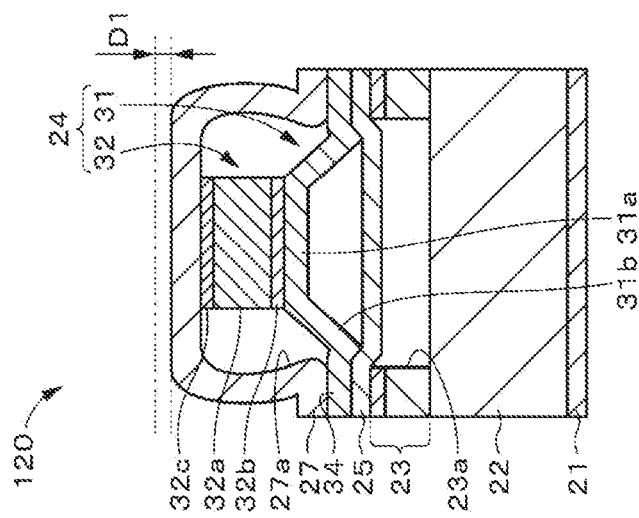
FIG. 18B is a cross-sectional view for explaining an operation example of the sensor module at a time of a gesture input operation.
Figure 18C:
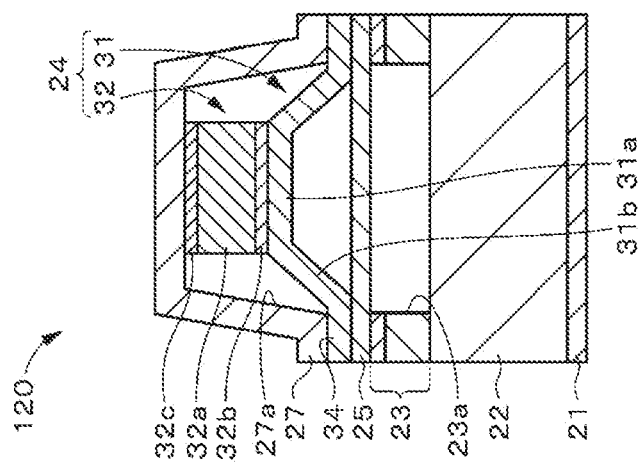
FIG. 18C is a cross-sectional view for explaining an operation example of the sensor module at a time of a key input operation.

As shown in FIG. 18A, a key top layer 27 that is subjected to edge cutting for each key to be separated may be provided. The key top layer 27 is configured by one film having flexibility, for example. The film has a plurality of depressed portions 27a disposed on positions corresponding to the structures 24, respectively. In the depressed portions 27a, the structures 24 are stored. Also in the case of providing the key top layer 27, as shown in FIG. 18B and 18C, the sensor module 120 operates in a way similar to that in the second embodiment at a time of performing the gesture and key input operations.

In the sensor module 120 according to the modified example 1 described above, the key top layer 27 that is separated for each key is provided, so it is possible to improve the sense of click.

(Modified Example 2)

Figure 19:
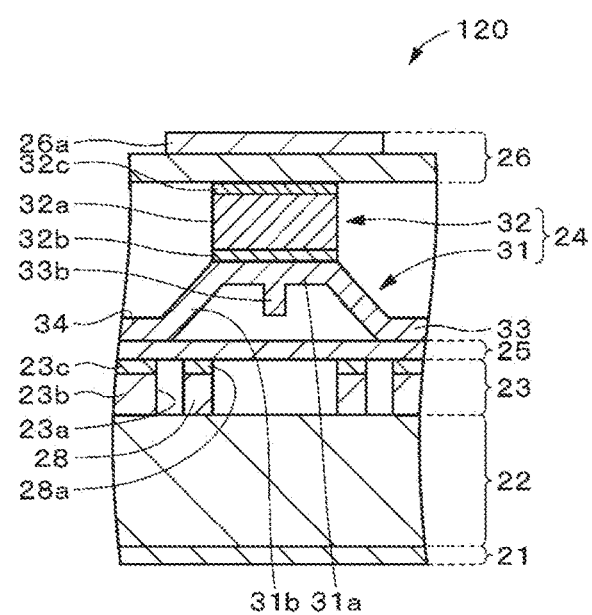
FIG. 19 is a cross-sectional view showing a configuration example of a sensor module according to a modified example 2 of the second embodiment of the present technology.

As shown in FIG. 19, the top portion 31a of the protruded portion 31 may have a projection portion 33b on a back surface side opposed to the reference electrode layer 25. Further, in the hole portion 23a of the intermediate layer 23, one or a plurality of support bodies 28 may be provided. The support body 28 is bonded to the back surface of the reference electrode layer 25 through an adhesive layer 28a provided on a top portion thereof, for example.

In the sensor module 120 according to the modified example 2 described above, the gesture input operation and the key input operation can be further clearly separated.

(Modified Examples 3 and 4)

In the sensor module 120 according to the second embodiment described above, the configuration of the structures 24 in the modified example 1 or 2 of the first embodiment may be used.

(Modified Examples 5 and 6)

In the sensor module 120 according to the second embodiment described above, the configuration of the structure in the modified example 9 of the first embodiment or the configuration of the support layer in the modified example 10 may be used.

(Modified Example 7)

Figure 28:
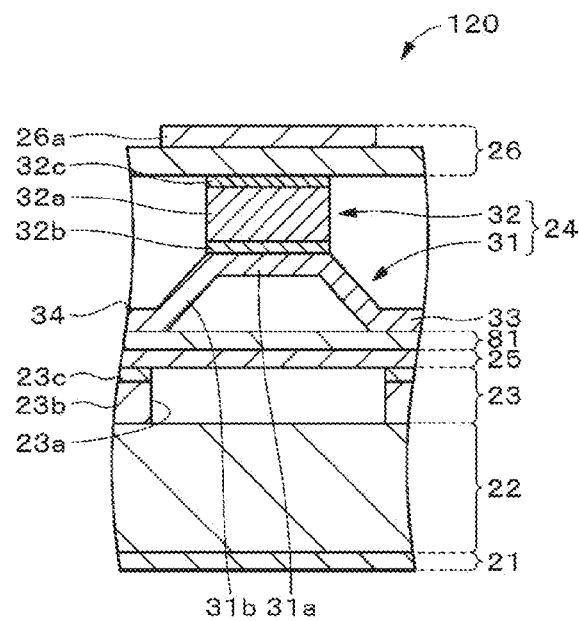
FIG. 28 is a cross-sectional view showing a configuration example of a sensor module according to a modified example 7 of the second embodiment of the present technology.

As shown in FIG. 28, between the reference electrode layer 25 and the embossed layer 33, a base layer 81 may be provided. The base layer 81 is not bonded onto the reference electrode layer 25 as a lower layer thereof with an adhesive layer or the like but is only placed thereon. The embossed layer 33 is bonded onto the base layer 81 with an adhesive layer or the like. The base layer 81 is similar to the base layer 51 in the modified example 6 of the first embodiment described above.

In the sensor module 120 in the modified example 7, the base layer 81 is further provided between the reference electrode layer 25 and the embossed layer 33. Therefore, even in the case where the sensor layer 22 and the embossed layer 33 are extended or contracted in an in-plane direction of the sensor layer 22 due to a change in environmental temperature or the like, it is possible to suppress the generation of distortion or the like in members that constitute the sensor module 120. Accordingly, it is possible to improve the reliability of the sensor module 120.

(Modified Example 8)

In the case where the reference electrode layer 25 is a conductive base material provided with a base material including polymer resin and a conductive layer disposed on the base material, the base material may have the same or substantially the same linear expansion coefficient as the embossed layer 33. In this case, it is also possible to increase the reliability of the sensor module 120 as in the modified example 7.

Further, in the case where the reference electrode layer 25 is a conductive base material including a conductive material and polymer resin, the base material may have the same or substantially the same linear expansion coefficient as the embossed layer 33. In this case, it is also possible to increase the reliability of the sensor module 120 as in the modified example 7.

<3. Third Embodiment>

Figure 20A:
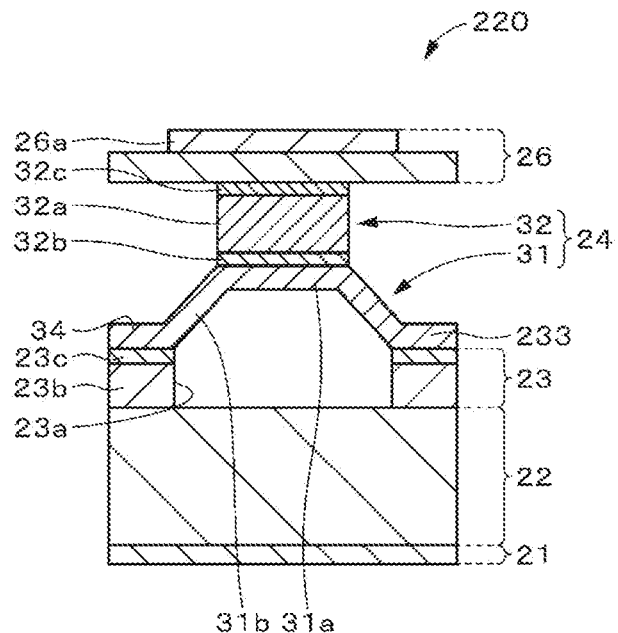
FIG. 20A is a cross-sectional view showing a configuration example of a sensor module according to a third embodiment of the present technology.

As shown in FIG. 20A, a sensor module 220 according to a third embodiment of the present technology is different from the sensor module 20 according to the first embodiment in that an embossed layer 233 doubles as a reference electrode layer. The embossed layer 233 is an embossed layer having conductivity. As an embossed layer 231, for example, a conductive film can be used. The conductive film is provided with a polymer resin film, and a conductive layer provided on the polymer resin film, for example. As the conductive film having the configuration described above, for example, a metal evaporation PET film or the like can be used.

(Modified Examples
(Modified Example 1)

Figure 20B:
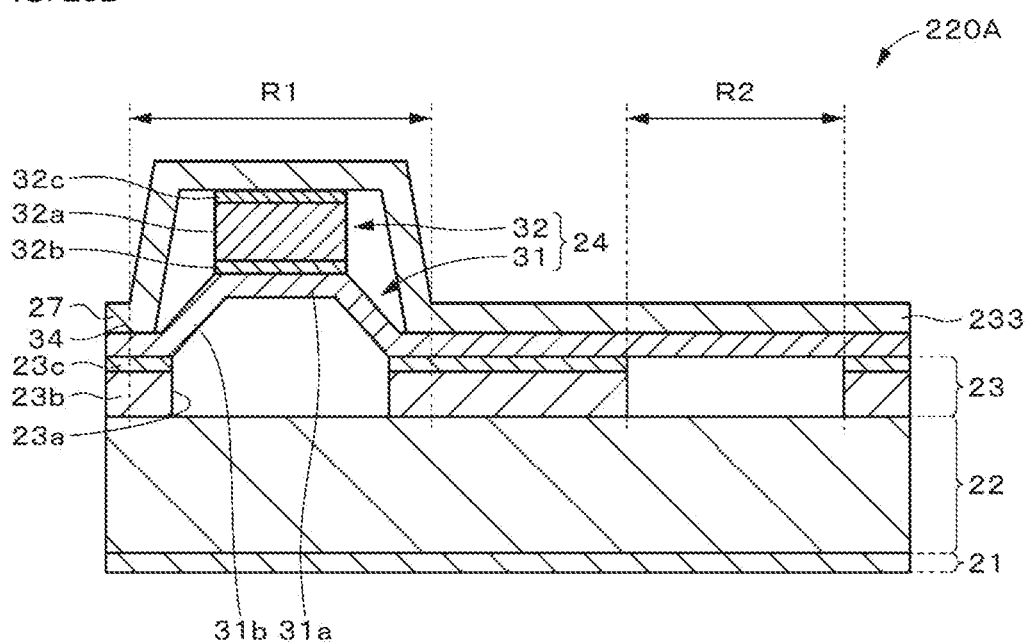
FIG. 20B is a cross-sectional view showing a configuration example of a sensor module according to a modified example of the third embodiment of the present technology.

As shown in FIG. 20B, the sensor module 220A may have an area R1 where the structure 24 is provided on a detection unit 22s and an area R2 where the structure 24 is not provided on the detection unit 22s. In the areas R1 and R2, a distance between the sensor layer 22 and the reference electrode layer 25 differs depending on existence or nonexistence of the structure 24. That is, in the area R1 where the structure 24 is provided, the distance between the sensor layer 22 and the reference electrode layer 25 is longer, and a reaction force is non-linearly changed with respect to a pressing amount (operation load). On the other hand, in the area R2 where the structure 24 is not provided, the distance between the sensor layer 22 and the reference electrode layer 25 is shorter, and the reaction force is linearly changed with respect to the pressing amount (operation load). Further, in the area R2, a high sensitivity is obtained with respect to a small deformation.

In the sensor module 220A having the configuration described above, a plurality of capacitance changes can be obtained. Specifically, in the area R1, a user can perform a keyboard operation, and can perform a gesture operation (touch pad operation) in the area R2.

(Modified Examples 2 and 3)

In the sensor module 220 in the third embodiment described above, the configuration of the structure 24 in the modified example 1 or 2 of the first embodiment described above may be used. Further, the configuration of the key top layer 27 in the modified example 1 of the second embodiment may be used.

<4. Fourth Embodiment>

Figure 21:
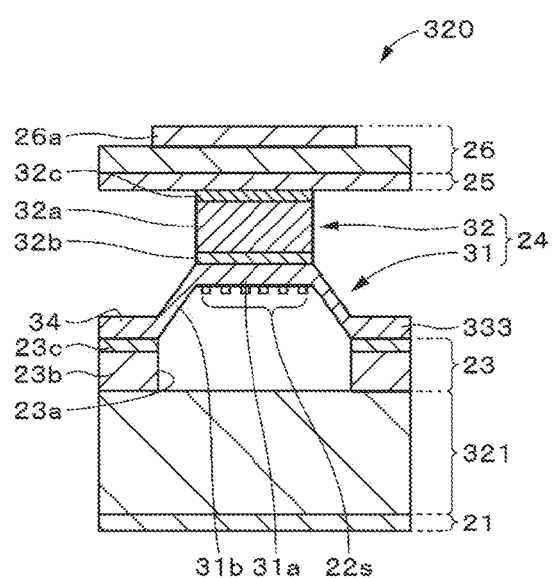
FIG. 21 is a cross-sectional view showing a configuration example of a sensor module according to a fourth embodiment of the present technology.

As shown in FIG. 21, a sensor module 320 according to the third embodiment of the present technology is different from the sensor module 20 according to the first embodiment in that the protruded portion 31 includes a detection unit for detecting a capacitance, that is, X and Y electrodes, and an embossed layer 333 doubles as a sensor layer. In the sensor module 320 according to the third embodiment, it is unnecessary to provide the sensor layer 22 between the reference electrode layer 21 and the intermediate layer 23. Instead, a polymer resin base material 321 or the like may be provided. It should be noted that a structure obtained by inverting the structure described above can also be used.

In the sensor module 320 according to the third embodiment, when non-linear deformation of the protruded portion 31 is caused, this acts in a direction in which the X and Y electrodes are distanced. Thus, a capacitance change rate is increased, and the sensitivity of the sensor is increased.

<5. Fifth Embodiment>

[Configuration of Uneven Film]

Figure 29A:
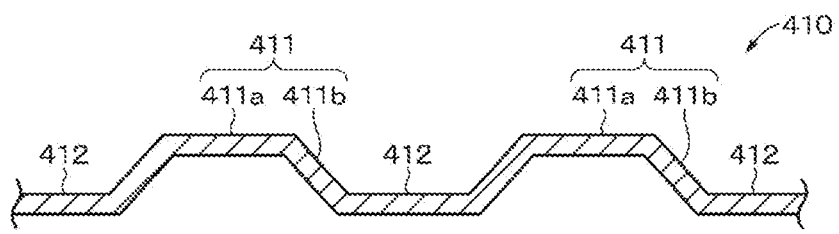
FIG. 29A is a cross-sectional view showing a configuration example of an uneven film according to a fifth embodiment of the present technology.

As shown in FIG. 29A, an uneven film 410 according to a fifth embodiment of the present technology is a so-called embossed film, and is provided with a bottom surface portion 412 and a plurality of pressing portions 411 that is provided so as to be protruded with respect to the bottom surface portion 412.

The uneven film 410 according to the fifth embodiment of the present technology is an uneven film disposed on the capacitance-type sensor layer 22, and can be applied to any of the sensor modules 20, 120, 220, 220A, and 320 according to the first to fourth embodiments and the modified examples thereof. The uneven film 410 can be used as either of the embossed layer 33 according to the first and second embodiments and the modified examples thereof. In the case where the uneven film 410 is applied to the sensor modules 20, 120, 220, 220A, and 320, generally, the bottom surface portion 412 is bonded to the capacitance-type sensor layer 22, the intermediate layer 23 disposed on the sensor layer 22, or the like. Further, on the pressing portions 411, the embossed layer 33 or the key top layer 26 is provided. It should be noted that the bottom surface portion 412 may not be bonded to the capacitance-type sensor layer 22, the intermediate layer 23 disposed on the sensor layer 22, or the like, but may only be placed thereon.

The pressing portions 411 as protruded portions are configured so as to be capable of being inverted into a depressed shape by pressing top portions of the pressing portions 411. The pressing portions 411 each are a reaction force structure, the reaction force of which is nonlinearly changed with respect to a pressing amount (that is, operation load).

The plurality of pressing portions 411 is provided on a front surface side of both main surfaces of the uneven film 410. The plurality of pressing portions 411 is one-dimensionally or two-dimensionally arranged in the plane of the uneven film 410. The pressing portion 411 is a structure configured by a protruded portion of the uneven film 410. A back surface side of the pressing portion 411 is a depressed portion that is depressed so as to be modeled on the pressing portion 411 as the protruded portion. Accordingly, the inside of the pressing portion 411 is a hollow space, a bottom surface of which is opened.

It is desirable that the shape of the pressing portion 411 be a frustum shape. Having such a shape makes it possible to reduce the height of the pressing portion 411 as compared to the case of having a dome shape. Here, the frustum shape refers to a shape of a remaining portion obtained by taking away a head portion of a cone along a plane parallel to a bottom surface thereof. Examples of the frustum shape include a conical frustum shape, a pyramid frustum shape, and a polygonal frustum shape such as a hexagonal frustum shape. It should be noted that the shape of the pressing portion 411 is not limited to this and may be another shape.

The pressing portion 411 is provided with a top portion 411a and a buckling portion 411b that supports the top portion 411a. A thickness of the top portion 411a may be thinner than that of the buckling portion 411b. The buckling portion 411b may be a cone shape, or may be configured by a large number of leg portions.

The bottom surface portion 412 may be a flat portion or may have unevenness as necessary.

A large number of through holes may be formed in the uneven film 410. As a material of the uneven film 410, for example, a material similar to that of the embossed layer 33 in the first embodiment can be used.

[Effect]

In the uneven film according to the fifth embodiment described above, by pressing the top portion of the pressing portion 411, the pressing portion 411 can be inverted into the depressed shape. Accordingly, it is possible to a desirable sense of click with a thin thickness.

(Modified Examples
(Modified Example 1)

Figure 29B:
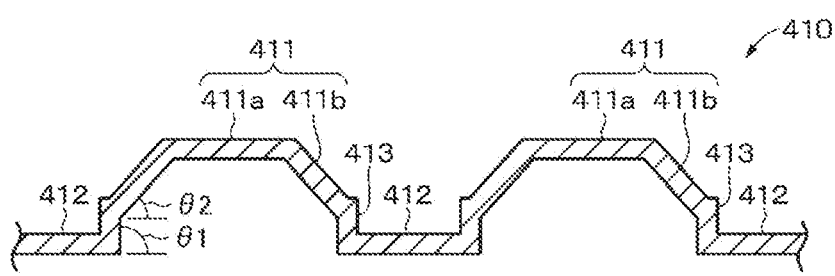
FIG. 29B is a cross-sectional view showing a configuration example of an uneven film according to a modified example 1 of the fifth embodiment of the present technology.

As shown in FIG. 29B, the uneven film 410 may be further provided with base portions 413 provided on bottom sides of the pressing portions 411. In the case of using this configuration, the sense of click can be improved.

The pressing portion 411 and the base portion 413 are configured by the protruded portion of the uneven film 410. A side surface of the base portion 413 is erected substantially vertically to the bottom surface portion 412 or is tilted with respect to the bottom surface portion 412 at a tilt angle of less than 90 degrees. It is desirable that an outer circumference of the bottom portion of the pressing portion 411 be in internal contact or substantially internal contact with an outer circumference of the top portion of the base portion 413. This is because this configuration further improves the sense of click. Specifically, for example, in the case where the pressing portion 411 has a conical frustum shape or a polygonal frustum shape, and the base portion 413 has a cube shape, it is desirable that the outer circumference of a circular shape or a polygonal shape of the bottom portion of the pressing portion 411 be in internal contact or substantially internal contact with an outer circumference of a square shape of the top portion of the base portion 413. From the viewpoint of the improvement of the sense of click, it is desirable that a tilt angle $\theta 1$ of the side surface of the base portion 413 be more than a tilt angle $\theta 2$ of the buckling portion 411b. Here, the tilt angles $\theta 1$ and $\theta 2$ are tilt angles measured with the back surface of the bottom surface portion 412 or the front surface of the sensor layer as a reference (0°).

(Modified Example 2)

Figure 29C:
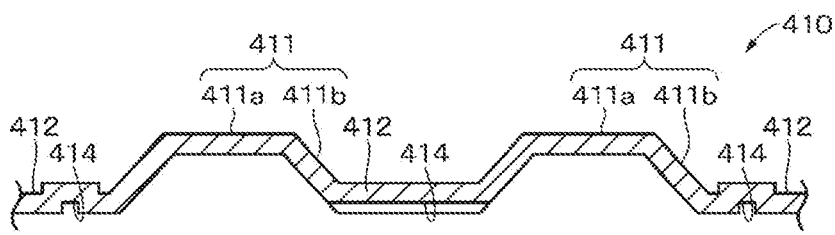
FIG. 29C is a cross-sectional view showing a configuration example of an uneven film according to a modified example 2 of the fifth embodiment of the present technology.

As shown in FIG. 29C, on the back surface of the uneven film 410, a depressed portion 414 provided in an extended manner so as to link the adjacent pressing portions 411 and link the periphery of the uneven film 410 and the pressing portions 411 may be provided.

When the uneven film 410 is applied to the sensor module, in the case where the uneven film 410 is bonded to the sensor layer or the intermediate layer or the like disposed on the sensor layer, the depressed portion 414 and the front surface of the sensor layer, the intermediate layer, or the like configure a hole portion. The hole portion functions as a vent for discharging air in inside space of the pressing portion 411 to outside when the pressing portion 411 is pressed.

It should be noted that in the case where the depressed portion 414 is formed on the uneven film 410 according to the modified example 1, it is only necessary to provide the depressed portion 414 that is extended so as to link the adjacent base portions 413 and link the periphery of the uneven film 410 and the base portion 413.

(Modified Example 3)

Figure 30A:
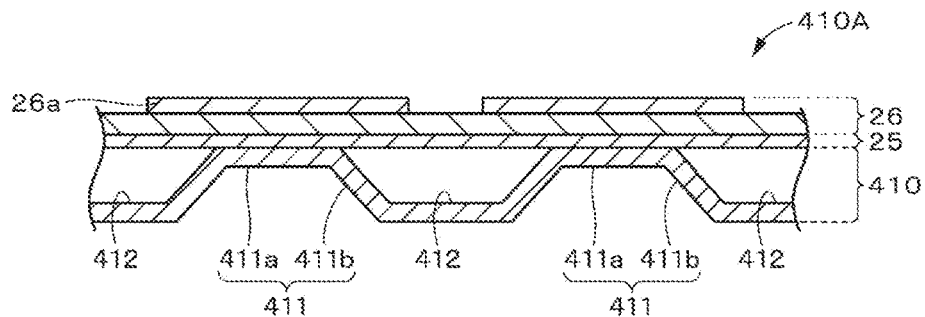
FIG. 30A is a cross-sectional view showing a configuration example of an uneven film according to a modified example 3 of the fifth embodiment of the present technology.

As shown in FIG. 30A, on the plurality of pressing portions 411, the key top layer 26 may be provided. In this case, the uneven film 410 and the key top layer 26 constitute an uneven structure 410A. The uneven structure 410A may be further provided with the reference electrode layer 25 between the plurality of pressing portions 411 and the key top layer 26.

(Modified Example 4)

Figure 30B:
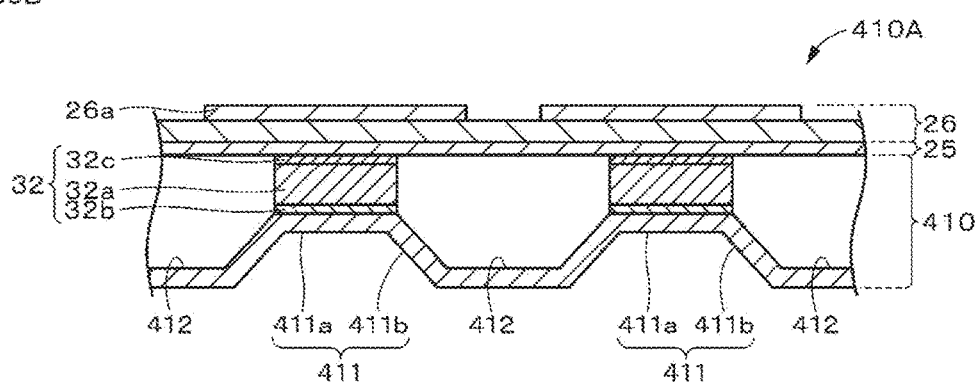
FIG. 30B is a cross-sectional view showing a configuration example of an uneven film according to a modified example 4 of the fifth embodiment of the present technology.

As shown in FIG. 30B, the uneven film 410 may be further provided with the plurality of pressure bodies 32 disposed on the plurality of pressing portions 411, respectively. Further, on the plurality of pressure bodies 32, the key top layer 26 may be provided. In this case, the uneven film 410, the plurality of pressure bodies 32, and the key top layer 26 constitute the uneven structure 410A. The uneven structure 410A may be further provided with the reference electrode layer 25 between the plurality of pressure bodies 32 and the key top layer 26.

(Modified Example 5)

Figure 30C:
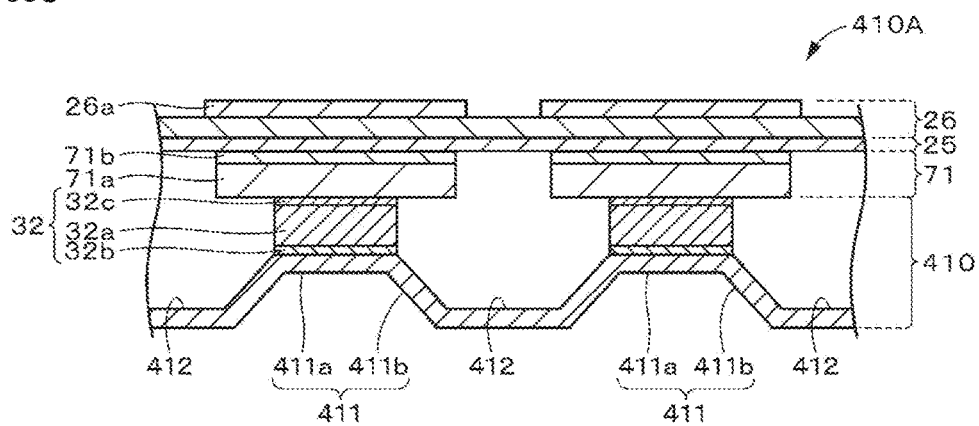
FIG. 30C is a cross-sectional view showing a configuration example of an uneven film according to a modified example 5 of the fifth embodiment of the present technology.

As shown in FIG. 30C, a plurality of support layers 71 may be further provided between the plurality of pressure bodies 32 and the key top layer 26, respectively. In the case where this configuration is used, it is possible to suppress a gritty feel of the pressing portions 411 through the key top layer 26 when the front surface of the key top layer 26 is touched with a finger or the like. FIG. 30C shows the example in which, on the pressing portions 411, the pressure bodies 32, the support layers 71, the reference electrode layer 25, and the key top layer 26 are provided. At least one kind of the pressure bodies 32, the reference electrode layer 25, and the key top layer 26 may not be provided. For example, only the support layers 71 may be provided on the pressing portions 411.

<6. Sixth Embodiment>

[Configuration of Uneven Structure]

Figure 31A:
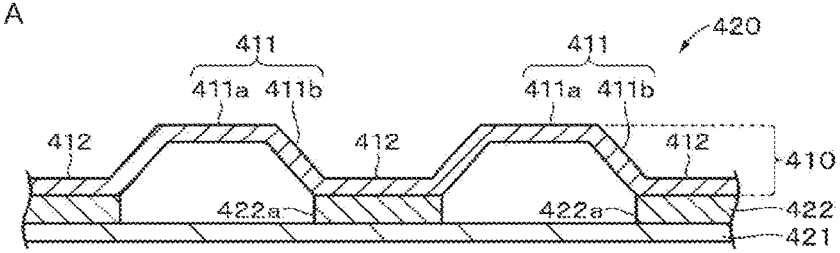
FIG. 31A is a cross-sectional view showing a configuration example of an uneven structure according to a sixth embodiment of the present technology.

As shown in FIG. 31A, an uneven structure 420 according to a sixth embodiment of the present technology is provided with a base layer 421, an adhesive layer 422, and the uneven film 410 fixed onto the base layer 421 through the adhesive layer 422. It should be noted that, in the sixth embodiment, parts similar to those in the fifth embodiment are denoted by the same symbols, and a description thereof will be omitted.

The uneven structure 420 according to the sixth embodiment of the present technology is disposed on the capacitance-type sensor layer 22, and can be applied to any of the sensor modules 20, 120, 220, 220A, and 320 according to the first and second embodiments and the modified examples thereof described above. In the case where the uneven structure 420 is applied to the sensor modules 20, 120, 220, 220A, and 320, normally, the base layer 421 is placed on the capacitance-type sensor layer 22 or the intermediate layer 23 disposed on the sensor layer 22. Further, on the pressing portions 411, the key top layer 26 is provided.

The base layer 421 and the uneven film 410 have the same or substantially the same linear expansion coefficient. The base layer 421 and the uneven film 410 may be made of the same material, or may be made of different materials having the same or substantially the same linear expansion coefficient. It is desirable that the base layer 421 be a film. As a material of the base layer 421, for example, it is possible to use a material similar to that of the embossed layer 33 in the first embodiment.

The adhesive layer 422 is provided between the bottom surface portion 412 of the uneven film and the base layer 421. The adhesive layer 422 has plurality of hole portions 422a that is formed on positions corresponding to a plurality of pressing portions 411, respectively. The hole portions 422a are through holes that penetrate the adhesive layer 422 from a front surface to a back surface thereof. When viewed in a direction vertical to the front surface of the uneven structure 420, the plurality of hole portions 422a is formed on positions superposed on the plurality of pressing portions 411. The pressing portions 411 is capable of being pressed into the hole portions 422a.

(Modified Examples (Modified Example 1)

Figure 31B:
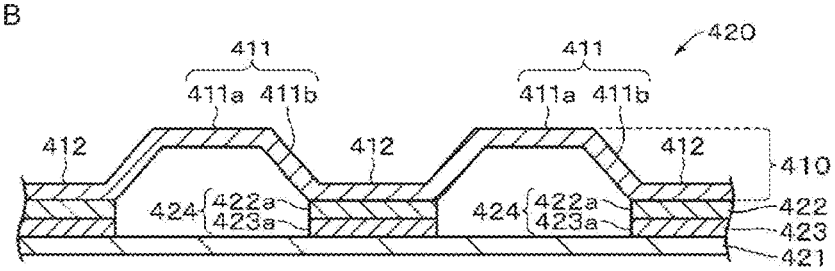
FIG. 31B is a cross-sectional view showing a configuration example of an uneven structure according to a modified example 1 of the sixth embodiment of the present technology.

As shown in FIG. 31B, a resin layer 423 disposed between the base layer 421 and the adhesive layer 422 may be further provided. The resin layer 423 is a film or a coating layer, for example. It is desirable that the resin layer 423 have a plurality of hole portions 423a formed on positions corresponding to the plurality of pressing portions 411, respectively. The hole portions 423a are through holes that penetrate the resin layer 423 from the front surface to the back surface thereof. The plurality of hole portions 423a is formed on positions superposed on the plurality of hole portions 422a, respectively. The hole portions 422a and 423a constitute one hoe portion 424. The pressing portion 411 is configured so as to be capable of being pressed into the hole portion 424.

(Modified Example 2)

Figure 31C:
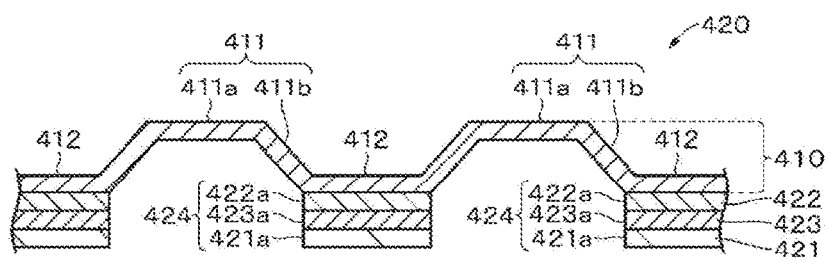
FIG. 31C is a cross-sectional view showing a configuration example of an uneven structure according to a modified example 2 of the sixth embodiment of the present technology.

As shown in FIG. 31C, the base layer 421 may have a plurality of hole portions 421a formed on positions corresponding to the plurality of pressing portions 411, respectively. The hole portions 421a are through holes that penetrate the base layer 421 from the front surface to the back surface thereof. The plurality of hole portions 421a are formed on positions superposed on the plurality of hole portions 422a and 423a, respectively. The hole portions 421a, 422a, and 423a constitute one hole portion 424. The pressing portion 411 may be configured so as to be capable of being pressed into the hole portion 424.

(Modified Example 3)

In the uneven structure 420 according to the sixth embodiment, the base layer 421 may have the plurality of hole portions 421a in the modified example 2 described above. In this case, the hole portions 421a and 422a constitute the one hole portion 424.

(Modified Example 4)

The base layer 421 and the uneven film 410 may be fixed to each other with an energy line curable resin composition such as an ultraviolet curable resin composition, an adhesive tape, or the like, and may be fixed by heat welding instead of the adhesive layer 422.

(Modified Example 5)

In the uneven structure 420 according to the sixth embodiment and the modified examples 1 to 4 thereof, a configuration similar to that in the modified examples 1 to 5 of the fifth embodiment may be used.

EXAMPLES

Hereinafter, the present technology will be specifically described on the basis of examples, but the present technology is not limited to only these examples.

The examples of the present technology will be described in the following order.

i. Relationship between thickness of intermediate layer and distance-pressure curve ii. Relationship between thickness of pressure body and distance-pressure curve iii. Relationship between kind of pressure body and sense of click iv. Relationship between shape of pressure body and sense of click v. Relationship between base portion of structure and sense of click <i. Relationship Between Thickness of Intermediate Layer and Distance-Pressure Curve>

Example 1-1

First, by cutting a brass plate, a transfer master was manufactured. Then, the transfer master and a biaxially oriented PET film having a thickness of 50 μm were superposed and set to a high-temperature vacuum press machine, and thermal transfer was performed. Thus, a plurality of protruded portions having a conical frustum shape and having a height of 175 μm and φ (diameter) 10 mm was formed on the PET film. As a result, an embossed PET film (embossed layer) was obtained.

Subsequently, a capacitance type sensor layer was prepared, and on a back surface of the sensor layer, a reference electrode layer was formed. Subsequently, by printing, on a front surface of the capacitance type sensor layer, an insulation layer and an adhesive layer were successively formed. Thus, an intermediate layer having a thickness of 100 μm in which a plurality of hole portions was arranged was formed. Subsequently, in such a manner that a plurality of structures on the embossed PET film coincides with the positions of the plurality of hole portions of the intermediate layer, through an adhesive layer, the embossed PET film was bonded to a front surface of the intermediate layer.

Subsequently, a circular two-sided adhesive tape having a size (diameter) φ of 6 mm and a thickness of 2 mm was prepared. Subsequently, the two-sided adhesive tape was bonded to top portions of the protruded portions, and on each of the protruded portions, a pressure body was formed. Subsequently, a key top layer, on a back surface of which the reference electrode layer was formed in advance was prepared, and the key top layer was bonded to the pressure body through the adhesive layer. As a result, an intended keyboard (sensor module) was obtained.

Example 1-2

In a way similar to the example 1-1 except that the thickness of the intermediate layer was set to 150 μm, a keyboard was obtained.

Comparison Example 1-1

Figure 22A:
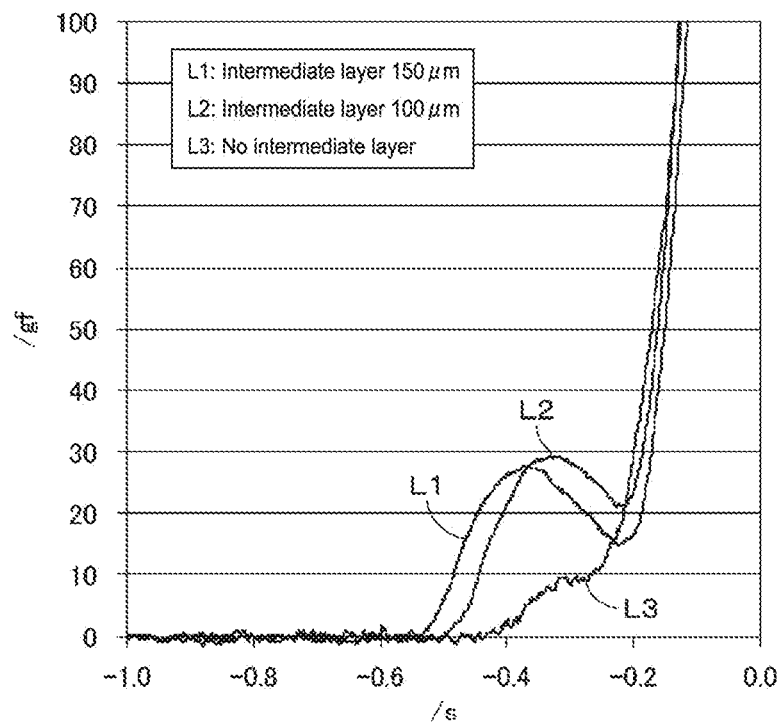
FIG. 22A is a graph showing a distance-pressure curve of a keyboard in examples 1-1 and 1-2 and a comparison example 1-1.

In a way similar to the example 1-1 except that forming the intermediate layer is omitted, a keyboard was obtained.
[Evaluation]
For the keyboards in the examples 1-1 and 1-2 and the comparison example 1-1 obtained as described above, the following evaluation was performed.
(Sense of Click)
By using a robot, the robot was moved in a z direction (direction vertical to input surface) at 1 mm/s, and with an indenter (pseudo finger made of silicone, φ 6 mm) attached to the robot, a sample was compressed. At this time, a pressure applied to the indenter was measured by a loadcell. As a result, distance-pressure curve (hereinafter, referred to as "F-S curve") was obtained. A result thereof is shown in FIG. 22A. Then, a maximum value that appears first is set as P1, and a minimum value that appears subsequently is set as P2. A click amount (P1−P2) and a click rate ((P1−P2)/P1) were obtained, and used as indicators of the sense of click.
(Electrical Characteristic)
By using the robot mentioned above, a capacitance change at a time when a load was imposed on the sample was measured. As a result, it was found that a relationship between a reaction force with respect to an operator and the capacitance change indicates a curve as shown in FIG. 8C.
[Evaluation Result]
In the examples 1 and 2 in which the intermediate layer was formed, on the F-S curve, the maximum value P1 and the minimum value P2 appeared. This is because formation of the intermediate layer enabled the structure to be inverted. On the other hand, in the comparison example 1 in which the intermediate layer was not formed, on the F-S curve, the maximum value P1 and the minimum value P2 do not appear. This is because the structure was incapable of being inverted due to nonexistence of the intermediate layer. Thus, it was found that forming the intermediate layer is necessary in order to obtain the F-S curve having the maximum value P1 and the minimum value P2.

<ii. Relationship Between Thickness of Pressure Body and Distance-Pressure Curve>

Example 2-1

In a way similar to the example 1-2 except that the thickness of the pressure body was set to 100 μm, a keyboard was obtained.

Example 2-2

In a way similar to the example 2-1 except that the thickness of the pressure body was set to 150 μm, a keyboard was obtained.

Example 2-3

In a way similar to the example 2-1 except that the thickness of the pressure body was set to 238 μm, a keyboard was obtained.

Comparison Example 2-1

Figure 22B:
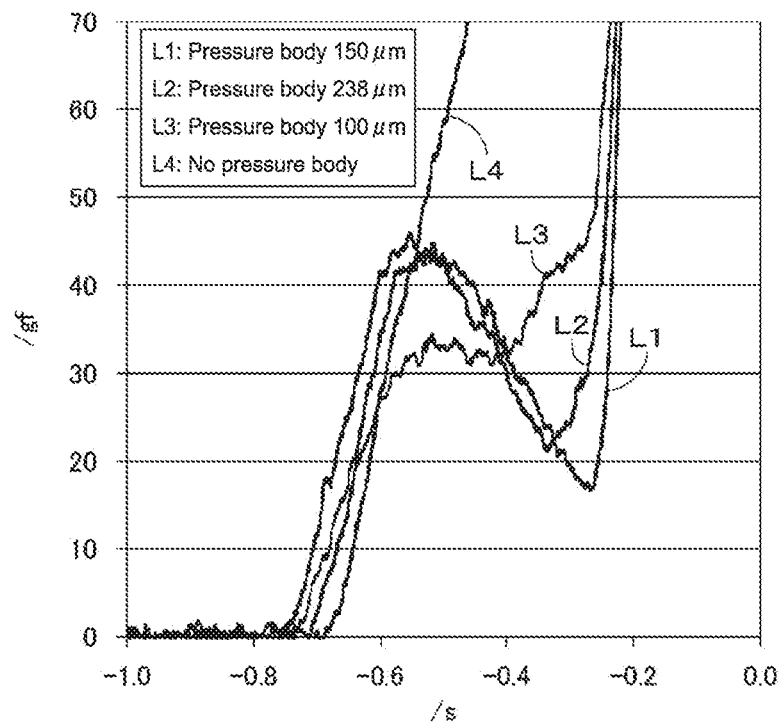

In a way similar to the example 2-1 except that forming the pressure body was omitted, a keyboard was obtained.
[Evaluation]
(Sense of Click)
The sense of click of each of the keyboards in the examples 2-1 to 2-3 and the comparison example 2-1 obtained as described above was evaluated in a way similar to the example 1-1. A result thereof is shown in FIG. 22B.
[Evaluation Result]
In the comparison example 2-1 in which the pressure body was not provided on the top portion of the protruded portions, the maximum value P1 and the minimum value P2 did not appear on the F-S curve. For this reason, the click rate cannot be defined. In the example 2-1 in which the thickness of the pressure body was equal to or less than the thickness of the intermediate layer, the click rate was markedly decreased. In the example 2-2 in which the thickness of the pressure body was equal to or more than the thickness of the intermediate layer, the click rate was improved. In the example 2-3 in which the thickness of the pressure body was sufficiently more than the thickness of the intermediate layer, the click rate was saturated and was substantially similar to the example 2-1.

Thus, in order to the positional relationship in the vertical direction between the top side of the structure and the bottom side of the structure, the pressure body is necessary. Further, from the viewpoint of the improvement of the click rate, it is desirable that the thickness of the pressure body be equal to or more than the thickness of the intermediate layer.

<iii. Relationship Between Kind of Pressure Body and Sense of Click>

Example 3-1

Figure 23A:
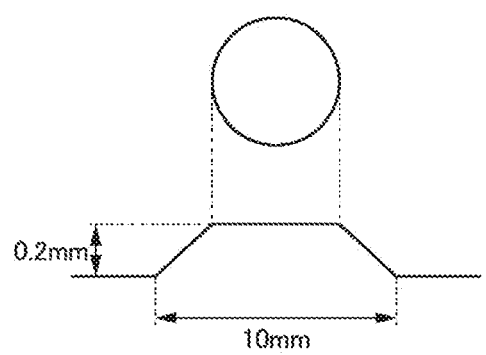
FIG. 23A is a schematic cross-sectional view showing a shape of a protruded portion in an example 3-1.

By a thermal transfer method, a plurality of protruded portions each having a shape and a size shown in FIG. 23A was formed on a PET film. In a way similar to the example 1-1 except this, a keyboard was obtained.

Example 3-2

Figure 23B:
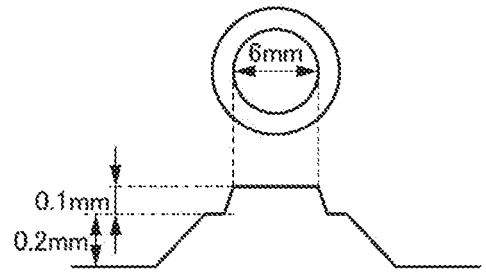
FIG. 23B is a schematic cross-sectional view showing a shape of a protruded portion in an example 3-2.

By a thermal transfer method, a plurality of protruded portions each having a shape and a size shown in FIG. 23B was formed on a PET film. On the protruded portions, through an adhesive layer, a key top layer was bonded on which a reference electrode layer was formed in advance. In a way similar to the example 3-1 except this, a keyboard was obtained.
[Evaluation]
(Sense of Click)
The sense of click of each of the keyboards in the examples 3-1 and 3-2 obtained as described above was evaluated in a way similar to the example 1-1. A result thereof is shown in table 1.

TABLE 1

|  | example 3-1 | example 3-2 |
|---|---|---|
| kind of pressure body | adhesive sheet | mold |
| PET film thickness [μm] | 50 | 50 |
| P1 [gf] | 23 | 20 |
| P2 [gf] | 20 | 16 |
| click rate [%] | 13.0 | 20.0 |
| click amount [gf] | 3 | 4 |

[Evaluation Result]

In the example 3-2 in which the pressure body was formed by a shape transfer, the click rate is improved as compared to the example 3-1 in which the pressure body was formed by a two-sided adhesive tape. Further, it is considered that the stiffness of an upper surface of the protruded portions is increased because of a tendency of an improvement of P1.

Thus, it is desirable that the pressure body be formed by the shape transfer from the viewpoint of the improvement of the click rate.

<iv. Relationship Between Shape of Pressure Body and Sense of Click>

Example 4-1

By a thermal transfer method, in the shape as shown in FIG. 23B, a plurality of protruded portions having such a shape and a size that a protruded shape on an upper portion thereof has a height of 0.12 mm was formed on a PET film. The key top layer was not bonded. In a way similar to the example 3-1 except this, a keyboard (test piece) was obtained.

Example 4-2

Figure 24A:
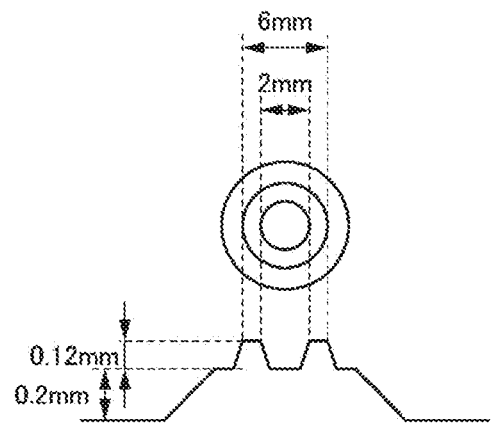
FIG. 24A is a schematic cross-sectional view showing a shape of a protruded portion in an example 4-2.

By a thermal transfer method, a plurality of protruded portions each having a shape and a size shown in FIG. 24A was formed on a PET film. In a way similar to the example 4-1 except this, a keyboard was obtained.

[Evaluation]
(Sense of Click)

The sense of click of the keyboard in the examples 4-1 and 4-2 obtained as described above was evaluated in a way similar to the example 1-1. A result thereof is shown in table 2.

TABLE 2

|  | example 4-1 | example 4-2 |
|---|---|---|
| kind of pressure body | adhesive sheet | mold |
| PET film thickness [μm] | 50 | 50 |
| depression diameter of shaped portion [mm] | — | 2 |
| P1 [gf] | 27 | 23 |
| P2 [gf] | 13 | 16 |
| click rate [%] | 51.3 | 29.9 |
| click amount [gf] | 14 | 7 |

[Evaluation Result]

In the example 4-2 in which a depression is formed on the center of the shaped portion (pressure body), there is a tendency to reduce the click rate as compared to the example 4-1 in which a depression is not formed on the center of the shaped portion. It is considered that this is because making the shape of the shaped portion complicated by forming the depression on the center thereof results in a quicker touch on a bottom at a time of pressing, and thus a stroke is reduced to increase P2.

Thus, in the case where the shaped portion is formed on the top portion of the protruded portions, from a viewpoint of the improvement of the click rate, it is desirable that the shaped portion have such a simple shape that the top portions of the protruded portions are partially or entirely uniformly protruded.

<v. Relationship Between Base Portion of Structure and Sense of Click>

Example 5-1

In a way similar to the example 1-1 except that as an embossed film, a biaxially oriented PET film having a thickness of 75 μm was used, a keyboard was obtained.

Example 5-2

Figure 24B:
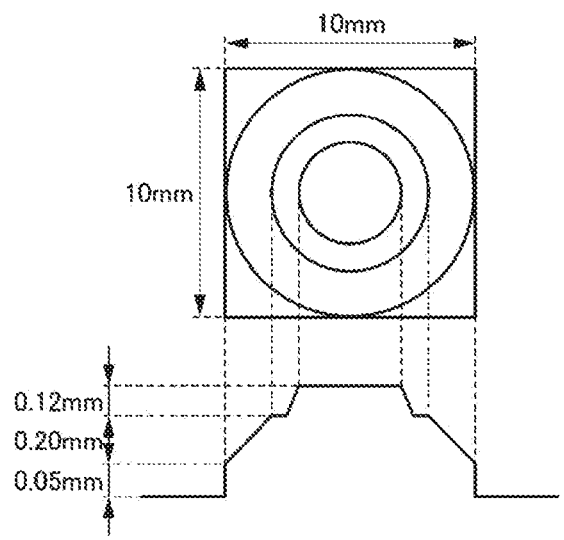
FIG. 24B is a schematic cross-sectional view showing a shape of a protruded portion in an example 5-2.

A plurality of protruded portions each having a shape and a size shown in FIG. 24B (protruded portion provided with a base portion on a bottom side having a conical frustum shape) was formed on a PET film. When viewed from a direction vertical to a front surface of the PET film, the shape of the base portion was set to be a square shape of 10 mm long and 10 mm wide. Further, a bottom surface diameter of the conical frustum shape was set to 10 mm. When viewed from a direction vertical to the front surface of the PET film, an outer circumference of the conical frustum shape on a bottom portion side was set so as to be in contact with an outer circumference of the base portion. In a way similar to the example 5-1 except this, a keyboard was obtained.

Example 5-3

When viewed from a direction vertical to the front surface of the PET film, the shape of the base portion is set to have a square shape of 12 mm long and 12 mm wide. That is, when viewed from a direction vertical to the front surface of the PET film, an outer circumference of the conical frustum shape on the bottom portion side was positioned on the inside of the base portion apart from an outer circumference thereof. In a way similar to the example 5-2 except this, a keyboard was obtained.

[Evaluation]
(Sense of Click)

The sense of click of the keyboard in each of the examples 5-1 to 5-3 obtained as described above was evaluated in a way similar to the example 1-1. A result thereof is shown in table 2.

TABLE 3

|  | configuration of hole portion | base portion size (vertical size, horizontal size) [mm] | P1 [gf] | P2 [gf] | click rate [%] | click amount [gf] |
|---|---|---|---|---|---|---|
| example 5-1 | only hole portion of intermediate layer | 10, 10 | 73 | 38 | 47.9 | 35 |
| example 5-2 | hole portion of intermediate layer + base portion of protruded portion | 10, 10 | 84 | 32 | 61.9 | 52 |

TABLE 3-continued

| | configuration of hole portion | base portion size (vertical size, horizontal size) [mm] | P1 [gf] | P2 [gf] | click rate [%] | click amount [gf] |
|---|---|---|---|---|---|---|
| example 5-3 | hole portion of intermediate layer + base portion of protruded portion | 12, 12 | 68 | 61 | 10.3 | 7 |

[Evaluation Result]

In the example 5-2 in which the intermediate layer and the base portion of the protruded portion were combined to form the hole portion, the click rate was improved as compared to the example 5-1 in which the hole portion was formed only by the intermediate layer. In the example 5-3 in which the outer circumference of the bottom portion side of the conical frustum shape portion is positioned on the inside of the base portion apart from the outer circumference thereof, the click rate was reduced as compared to the example 5-2 in which the outer circumference of the bottom portion side of the conical frustum shape is in contact with the outer circumference of the base portion. The case where the hole portion is formed only by the intermediate layer, and an inner circumference of the structure on a bottom portion side is positioned inside the hole portion of the intermediate layer apart from the outer circumference of the hole portion also has this tendency.

In the above, the embodiments and the examples of the present technology are described. The present technology is not limited to the above embodiments and examples, and various modifications based on of the technical idea of the present technology can be made.

For example, the configurations, methods, processes, shapes, materials, numerals, and the like given in the above embodiments and examples merely examples, and when necessary, different configurations, methods, processes, shapes, materials, numerals, and the like may be used.

Further, the configurations, methods, processes, shapes, materials, numerals, and the like given in the above embodiments and examples can be combined with each other without departing from the gist of the present technology.

Further, in the above embodiments, the case where the input apparatus is the keyboard provided with the plurality of keys is described as an example. The input apparatus may be a switch, a button, or the like provided with one key.

Furthermore, in the above embodiments and the modified examples thereof, it is unnecessary to bond the intermediate layer and the sensor layer to each other. Further, a member such as a backlight may be provided between the intermediate layer and the sensor layer.

Further, the present technology can have the following configuration.

(1) An input apparatus, including:

a conductive layer having flexibility;

a plurality of structures, a reaction force of which is non-linearly changed with respect to a pressing amount;

a capacitance-type sensor layer; and an intermediate layer disposed between the plurality of structures and the sensor layer, in which the intermediate layer has a plurality of hole portions into which the plurality of structures is pressed, respectively.

(2) The input apparatus according to (1), in which the structure includes a protruded portion and a pressure body provided on a top portion of the protruded portion.

(3) The input apparatus according to (2), in which the pressure body is configured by a shape given to the top portion of the protruded portion.

(4) The input apparatus according to (3), in which the shape is obtained by causing the top portion of the protruded portion to project partially or entirely uniformly.

(5) The input apparatus according to (2) or (3), in which the pressure body has a thickness equal to or more than a depth of the hole portion and equal to or less than a height of the protruded portion.

(6) The input apparatus according to any one of (1) to (5), in which the top portion of the structure is thicker than a buckling portion of the structure.

(7) The input apparatus according to any one of (1) to (6), in which the top portion of the structure includes a material having higher hardness than a buckling portion of the structure.

(8) The input apparatus according to any one of (1) to (7), in which the plurality of structures is configured by an embossed film.

(9) The input apparatus according to any one of (1) to (8), in which the structure has a plurality of hole portions.

(10) The input apparatus according to any one of (1) to (9), in which the structure includes a buckling portion constituted of a plurality of leg portions.

(11) The input apparatus according to any one of (1) to (10), in which the structure has a vent formed therein.

(12) The input apparatus according to any one of (1) to (11), in which the plurality of structures is disposed between the conductive layer and the intermediate layer.

(13) The input apparatus according to any one of (1) to (11), in which the conductive layer is disposed between the plurality of structures and the intermediate layer.

(14) The input apparatus according to (12), in which the structure has a side surface that is elected or tilted with respect to a front surface of the intermediate layer and includes a base portion having a square circumference and a protruded portion that is provided on the base portion and has a conical frustum shape.

(15) The input apparatus according to (14), in which an outer circumference of the protruded portion on a bottom portion side is substantially in contact with the outer circumference of the base portion.

(16) The input apparatus according to (12), in which a support portion that supports the conductive layer is provided around the structure.

(17) The input apparatus according to (16), in which between a top portion of the structure and the conductive layer, a space is formed.

(18) The input apparatus according to (13), in which the structure is provided inside an outer circumference of the hole portion of the intermediate layer.

(19) A keyboard including the input apparatus according to any one of (1) to (18).

(20) An electronic apparatus including the input apparatus according to any one of (1) to (18).

(21) The input apparatus according to (12), in which the structure includes a base portion having a side surface that is substantially vertically erected or tilted with respect to a front surface of the intermediate layer, and a protruded portion provided on the base portion.

(22) The input apparatus according to (12), further including:
a base layer disposed between the sensor layer and the intermediate layer, in which
the plurality of structures is configured by an embossed layer, and
the base layer has the same or substantially the same linear expansion coefficient as the embossed layer.

(23) The input apparatus according to (22), in which the base layer has a plurality of hole portions into which the plurality of structures are pressed, respectively.

(24) The input apparatus according to (12), in which the sensor layer includes a base material,
the plurality of structures is configured by an embossed layer, and
the base material has the same or substantially the same linear expansion coefficient as the embossed layer.

(25) The input apparatus according to (13), further including:
a base layer disposed between the plurality of structures and the conductive layer, in which
the plurality of structures is configured by an embossed layer, and
the base layer has the same or substantially the same linear expansion coefficient as the embossed layer.

(26) The input apparatus according to (13), in which the conductive layer includes a base material,
the plurality of structures is configured by an embossed layer, and the base material has the same or substantially the same linear expansion coefficient as the embossed layer.

(27) The input apparatus according to any one of (1) to (18) and (21) to (26), in which
the structure includes a protruded portion, a first pressure body provided on a top portion of the protruded portion, and a second pressure body provided on the first pressure body.

(28) The input apparatus according to (27), in which the first pressure body is configured by a shape given to the top portion of the protruded portions, and
the second pressure body is configured by an adhesive film. (29) The input apparatus according to any one of (1) to (18) and (21) to (28), further including:
a key top layer including a plurality of keys; and
a plurality of support layers respectively disposed between the plurality of structures and the key top layer.

(30) A keyboard including the input apparatus according to any one of (21) to (29).

(31) An electronic apparatus including the input apparatus according to any one of (21) to (29).

(32) A sensor, including:
a conductive layer having flexibility;
a plurality of structures, a reaction force of which is non-linearly changed with respect to a pressing amount;
a capacitance-type sensor layer; and
an intermediate layer disposed between the plurality of structures and the sensor layer), in which
the intermediate layer has a plurality of hole portions into which the plurality of structures is pressed, respectively.

(33) A sensor, including:
a conductive layer having flexibility;
a structure, a reaction force of which is non-linearly changed with respect to a pressing amount;
a capacitance-type sensor layer; and
an intermediate layer disposed between the structure and the sensor layer), in which
the intermediate layer has a hole portion into which the structure is pressed.

(34) An uneven film disposed on a capacitance-type sensor layer, including:
a plurality of pressing portions, a reaction force of which is non-linearly changed with respect to a pressing amount, in which
the pressing portions are configured by protruded portions of unevenness.

(35) The uneven film according to (34), in which the pressing portion further includes a base portion disposed on a bottom side of the pressing portion, and
the pressing portion and the base portion are configured by protruded portions of unevenness.

(36) The uneven film according to (35), in which the pressing portion has a frustum shape, and
the base portion has a rectangular parallelepiped shape.

(37) The uneven film according to (35) or (36), in which an outer circumference of a bottom portion of the pressing portion is in internal contact or substantially internal contact with an outer circumference of a top portion of the base portion.

(38) The uneven film according to any one of (35) to (37), in which
a tilt angle of a side surface of the base portion is larger than a tilt angle of a buckling portion of the pressing portion.

(39) The uneven film according to any one of (34) to (38), further including:
a pressure body disposed on the pressing portion. (40) The uneven film according to any one of (34) to (39), further including:
a key top layer disposed on the plurality of pressing portions.

(41) The uneven film according to (40), further including:
a plurality of support layer disposed between the plurality of pressing portions and the key top layer, respectively.

(42) An uneven structure disposed on a capacitance-type sensor layer, including:
a base layer;
an uneven film fixed onto the base layer; and
a plurality of pressing portions, a reaction force of which is non-linearly changed with respect to a pressing amount, in which
the pressing portions are configured by protruded portions of unevenness.

(43) The uneven structure according to (42), in which the base layer and the uneven film have the same or substantially the same linear expansion coefficient.

(44) The uneven structure according to (42) or (43), further including:
an adhesive layer disposed between the base layer and the uneven film.

(45) The uneven structure according to (44), in which the adhesive layer has a plurality of hole portions formed on positions corresponding to the plurality of pressing portions, respectively.

(46) The uneven structure according to (44), further including:
a resin layer disposed between the base layer and the adhesive layer.

(47) The uneven structure according to (46), in which the adhesive layer and the resin layer have a plurality of hole portions formed on positions corresponding to the plurality of pressing portions, respectively.

(48) The uneven structure according to (46), in which
the base layer, the adhesive layer, and the resin layer have a plurality of hole portions formed on positions corresponding to the plurality of pressing portions, respectively.

(49) The uneven structure according to (45), (47), or (48), in which
the pressing portions are configured to be capable of being pressed into the hole portions.

(50) The uneven structure according to any one of (42) to (49), in which
the pressing portion further includes a base portion disposed on a bottom side of the pressing portion, and
the pressing portion and the base portion are configured by protruded portions of unevenness.

(51) The uneven structure according to (50), in which
the pressing portion has a frustum shape, and
the base portion has a rectangular parallelepiped shape.

(52) The uneven structure according to (50) or (51), in which
an outer circumference of a bottom portion of the pressing portion in internal contact or substantially internal contact with an outer circumference of a top portion of the base portion.

(53) The uneven structure according to any one of (50) or (52), in which
a tilt angle of the base portion is larger than a tilt angle of the pressing portion.

(54) The uneven structure according to any one of (42) or (53), further including:
a pressure body disposed on the pressing portion. (55) The uneven structure according to any one of (42) or (54), further including:
a key top layer disposed on the plurality of pressing portions.

(56) The uneven structure according to (55), further including:
a plurality of support layers disposed between the plurality of pressing portions and the key top layer, respectively.

REFERENCE SIGNS LIST 10 electronic apparatus
11 input apparatus
12 host
13 display apparatus
14 controller IC
20 sensor module
21, 25 reference electrode layer
22 sensor layer
23 intermediate layer
24 structure
26 key top layer
31 protruded portions
31a top portion
31b buckling portion
32 pressure body
33 embossed layer
34 flat portion
41 base material
42 X electrode
43 Y electrode
44 insulation layer

The invention claimed is:
1. An input apparatus, comprising:
a conductive layer having flexibility;
a plurality of structures, a reaction force of which is non-linearly changed with respect to a pressing amount;
a capacitance-type sensor layer; and
an intermediate layer disposed between the plurality of structures and the capacitance-type sensor layer, wherein
the intermediate layer has a plurality of first hole portions into which the plurality of structures is pressed, respectively.
2. The input apparatus according to claim 1, wherein
each of the plurality of structures includes a protruded portion and a pressure body, wherein the pressure body is on a top portion of the protruded portion.
3. The input apparatus according to claim 2, wherein
the pressure body is configured by a shape given to the top portion of the protruded portion.
4. The input apparatus according to claim 3, wherein
the shape is obtained by causing the top portion of the protruded portion to project partially or entirely uniformly.
5. The input apparatus according to claim 2, wherein
the pressure body has a thickness equal to or more than a depth of each of the plurality of first hole portions, and wherein the depth of each of the plurality of first hole portions is equal to or less than a height of the protruded portion.
6. The input apparatus according to claim 1, wherein
a top portion of each of the plurality of structures is thicker than a buckling portion of each of the plurality of structures.
7. The input apparatus according to claim 1, wherein
a top portion of each of the plurality of structures includes a material having higher hardness than a buckling portion of each of the plurality of structures.
8. The input apparatus according to claim 1, wherein
the plurality of structures is configured by an embossed film that includes a plurality of second hole portions.
9. The input apparatus according to claim 8, wherein
each of the plurality of structures has a corresponding second hole portion of the plurality of second hole portions.
10. The input apparatus according to claim 1, wherein
each of the plurality of structures includes a buckling portion constituted of a plurality of leg portions.
11. The input apparatus according to claim 1, wherein
each of the plurality of structures has a vent formed therein.
12. The input apparatus according to claim 1, wherein
the plurality of structures is disposed between the conductive layer and the intermediate layer.
13. The input apparatus according to claim 1, wherein
the conductive layer is disposed between the plurality of structures and the intermediate layer.
14. The input apparatus according to claim 12,
wherein each of the plurality of structures has a side surface that is elected or tilted with respect to a front surface of the intermediate layer,
wherein each of the plurality of structures includes a base portion having a square circumference, and a protruded portion that is provided on the base portion, and
wherein the protruded portion has a conical frustum shape.
15. The input apparatus according to claim 14, wherein
an outer circumference of the protruded portion on a bottom portion side is substantially in contact with the outer circumference of the base portion.

16. The input apparatus according to claim 12, wherein
a support portion that supports the conductive layer is provided around each of the plurality of structures.

17. The input apparatus according to claim 16, wherein between a top portion of each of the plurality of structures and the conductive layer, a space is formed.

18. The input apparatus according to claim 13, wherein each of the plurality of structures is provided inside an outer circumference of a corresponding hole portion of the plurality of first hole portions of the intermediate layer.

19. The input apparatus according to claim 12, wherein each of the plurality of structures includes a base portion having a side surface that is substantially vertically erected or tilted with respect to a front surface of the intermediate layer, and a protruded portion provided on the base portion.

20. The input apparatus according to claim 12, further comprising:
a base layer disposed between the capacitance-type sensor layer and the intermediate layer, wherein
the plurality of structures is configured by an embossed layer, and
wherein the base layer has same or substantially same linear expansion coefficient as the embossed layer.

21. The input apparatus according to claim 20, wherein the base layer has a plurality of second hole portions into which the plurality of structures are pressed, respectively.

22. The input apparatus according to claim 12, wherein the capacitance-type sensor layer includes a base material, wherein the plurality of structures is configured by an embossed layer, and
wherein the base material has same or substantially same linear expansion coefficient as the embossed layer.

23. The input apparatus according to claim 13, further comprising:
a base layer disposed between the plurality of structures and the conductive layer, wherein
the plurality of structures is configured by an embossed layer, and
wherein the base layer has same or substantially same linear expansion coefficient as the embossed layer.

24. The input apparatus according to claim 13, wherein the conductive layer includes a base material,
the plurality of structures is configured by an embossed layer, and
the base material has same or substantially same linear expansion coefficient as the embossed layer.

25. The input apparatus according to claim 1, wherein each of the plurality of structures includes a protruded portion, a first pressure body provided on a top portion of the protruded portion, and a second pressure body provided on the first pressure body.

26. The input apparatus according to claim 25, wherein the first pressure body is configured by a shape given to the top portion of the protruded portion, and
the second pressure body is configured by an adhesive film.

27. The input apparatus according to claim 1, further comprising:
a key top layer including a plurality of keys; and
a plurality of support layers respectively disposed between the plurality of structures and the key top layer.

28. A sensor, comprising:
a conductive layer having flexibility;
a plurality of structures, a reaction force of which is non-linearly changed with respect to a pressing amount;
a capacitance-type sensor layer; and
an intermediate layer disposed between the plurality of structures and the capacitance-type sensor layer, wherein
the intermediate layer has a plurality of hole portions into which the plurality of structures is pressed, respectively.

29. A sensor, comprising:
a conductive layer having flexibility;
a structure, a reaction force of which is non-linearly changed with respect to a pressing amount;
a capacitance-type sensor layer; and
an intermediate layer disposed between the structure and the capacitance-type sensor layer, wherein
the intermediate layer has a hole portion into which the structure is pressed.

30. A keyboard, comprising:
a conductive layer having flexibility;
a plurality of structures, a reaction force of which is non-linearly changed with respect to a pressing amount;
a capacitance-type sensor layer; and
an intermediate layer disposed between the plurality of structures and the capacitance-type sensor layer, wherein
the intermediate layer has a plurality of hole portions into which the plurality of structures is pressed, respectively.

31. An electronic apparatus, comprising:
a conductive layer having flexibility;
a plurality of structures, a reaction force of which is non-linearly changed with respect to a pressing amount;
a capacitance-type sensor layer; and
an intermediate layer disposed between the plurality of structures and the capacitance-type sensor layer, wherein
the intermediate layer has a plurality of hole portions into which the plurality of structures is pressed, respectively.

* * * * *